United States Patent
Porter et al.

(10) Patent No.: US 9,739,857 B2
(45) Date of Patent: Aug. 22, 2017

(54) METHOD AND MAGNETIC RESONANCE APPARATUS FOR ECHO PLANAR IMAGING WITH DATA ENTRY INTO K-SPACE ALONG A ZIGZAG TRAJECTORY

(71) Applicants: David Andrew Porter, Poxdorf (DE); Robin Heidemann, Strullendorf (DE)

(72) Inventors: David Andrew Porter, Poxdorf (DE); Robin Heidemann, Strullendorf (DE)

(73) Assignees: Siemens Aktiengesellschaft, Munich (DE); Max-Planck-Gesellschaft zur Foerderung der Wissenschaften E.V., Munich (DE)

( * ) Notice: Subject to any disclaimer, the term of this patent is extended or adjusted under 35 U.S.C. 154(b) by 792 days.

(21) Appl. No.: 14/154,364

(22) Filed: Jan. 14, 2014

(65) Prior Publication Data

US 2014/0197834 A1    Jul. 17, 2014

(30) Foreign Application Priority Data

Jan. 14, 2013  (DE) .................. 10 2013 100 349

(51) Int. Cl.
| | | |
|---|---|---|
| G01V 3/00 | (2006.01) | |
| G01R 33/48 | (2006.01) | |
| G01R 33/561 | (2006.01) | |

(52) U.S. Cl.
CPC ..... G01R 33/4818 (2013.01); G01R 33/4824 (2013.01); G01R 33/5616 (2013.01); *G01R 33/5611* (2013.01)

(58) Field of Classification Search
CPC .......... G01R 33/4818; G01R 33/4824; G01R 33/5616; G01R 33/5611

USPC .......................................... 324/309
See application file for complete search history.

(56) References Cited

U.S. PATENT DOCUMENTS

| | | | | |
|---|---|---|---|---|
| 4,746,864 A * | 5/1988 | Satoh | ................ | G01R 33/5615 324/307 |
| 5,361,028 A * | 11/1994 | Kanayama | ......... | G01R 33/5615 324/307 |
| 5,432,448 A * | 7/1995 | Heid | .................. | G01R 33/5615 324/309 |
| 5,545,990 A * | 8/1996 | Kiefer | .............. | G01R 33/56554 324/307 |
| 7,061,241 B2 * | 6/2006 | Le Roux | ................ | G01R 33/50 324/309 |
| 7,944,206 B2 * | 5/2011 | Frydman | ............ | G01R 33/4822 324/307 |

(Continued)

OTHER PUBLICATIONS

"Cross-encoded magnetic resonance imaging in inhomogeneous fields," Paquin et al., Journal of Magnetic Resonance, vol. 201 (2009), pp. 199-204.

*Primary Examiner* — Susan Lee
(74) *Attorney, Agent, or Firm* — Schiff Hardin LLP

(57) ABSTRACT

In a method and apparatus for echo planar magnetic resonance (MR) imaging sequence of phase encoding gradient fields and a sequence of readout gradient fields are applied in order to produce a well-defined zigzag-type trajectory for entering raw data into k-space. Zigzag-type trajectories can be achieved that have flanks without curvature, or without significant curvature. Cartesian methods for image reconstruction of parallel MR imaging are applied to echo planar MR imaging with such zigzag-type trajectories.

17 Claims, 12 Drawing Sheets

(56) References Cited

U.S. PATENT DOCUMENTS

| | | | | |
|---|---|---|---|---|
| 8,664,954 B2* | 3/2014 | Hetzer | ............... | G01R 33/4818 |
| | | | | 324/309 |
| 8,680,859 B2* | 3/2014 | Takei | ................ | G01R 33/4818 |
| | | | | 324/307 |
| 2012/0313640 A1* | 12/2012 | Pfeuffer | ................ | A61B 5/055 |
| | | | | 324/309 |
| 2012/0313641 A1* | 12/2012 | Labadie | ............ | G01R 33/4818 |
| | | | | 324/309 |

* cited by examiner

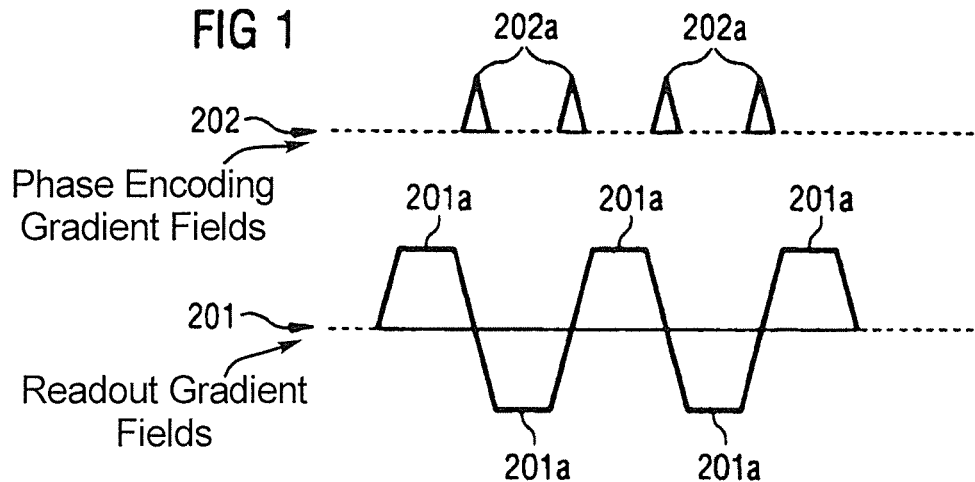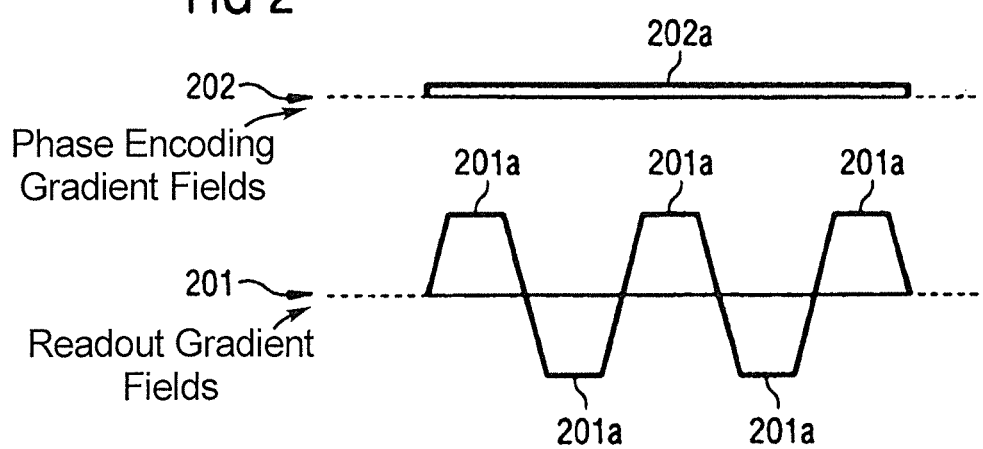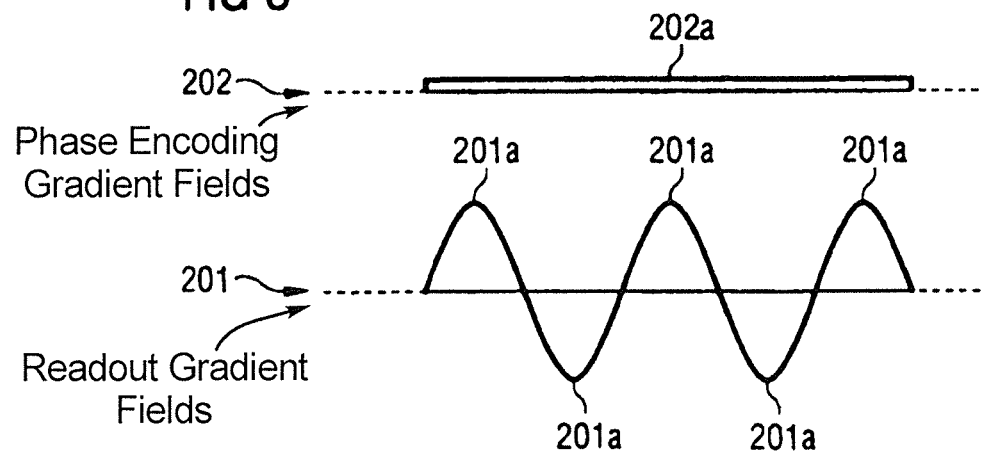

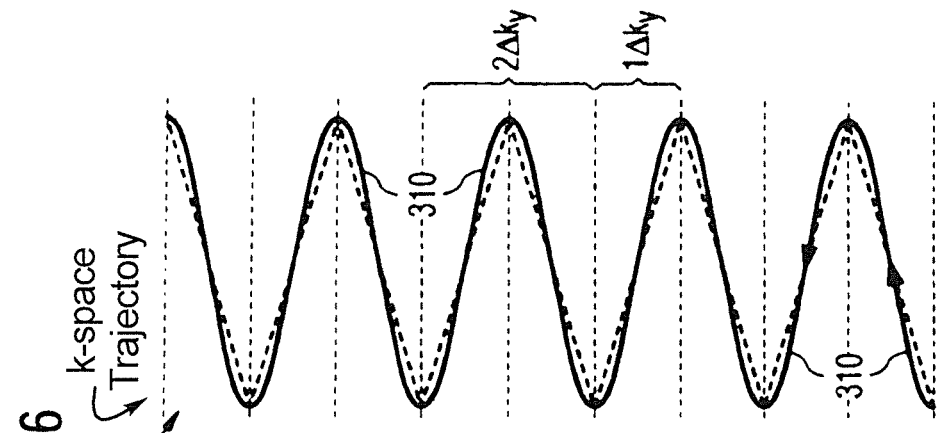
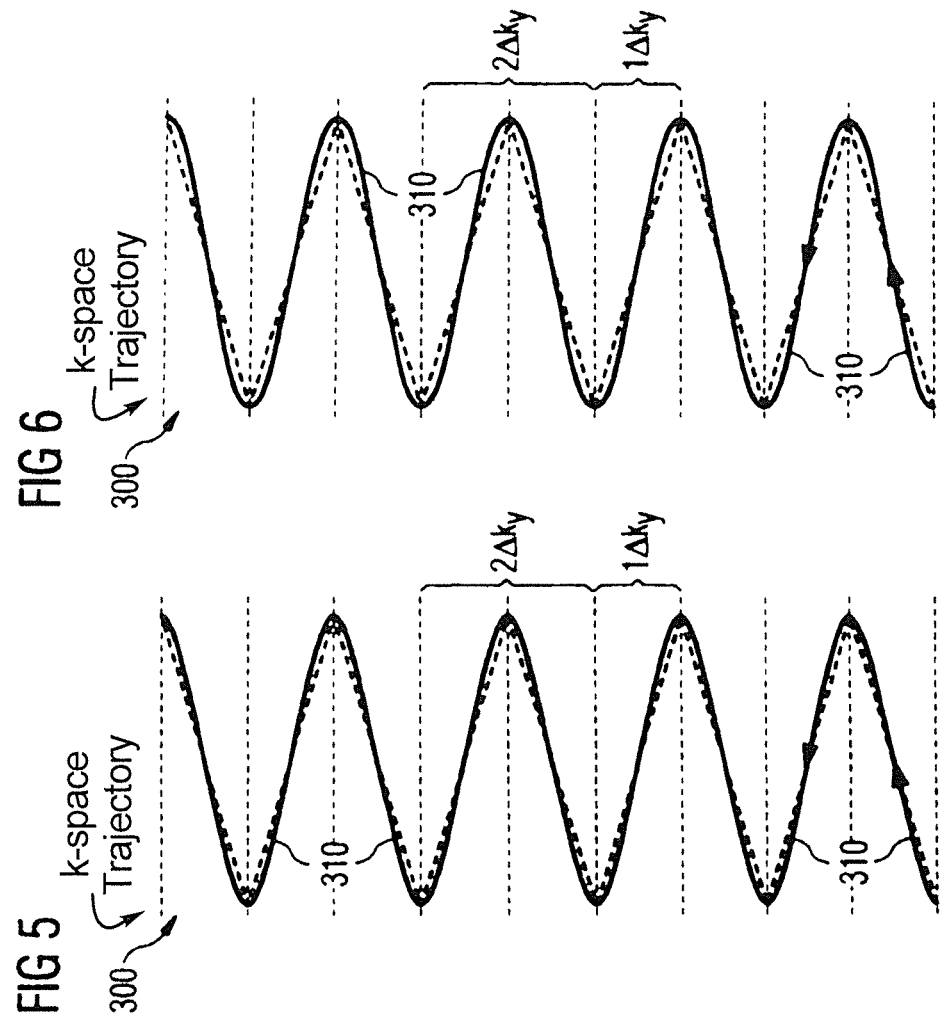
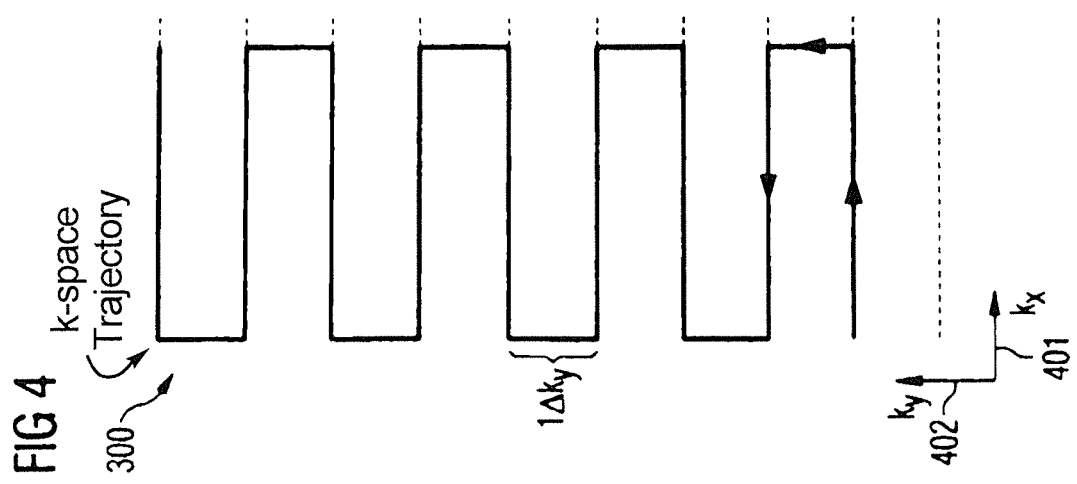

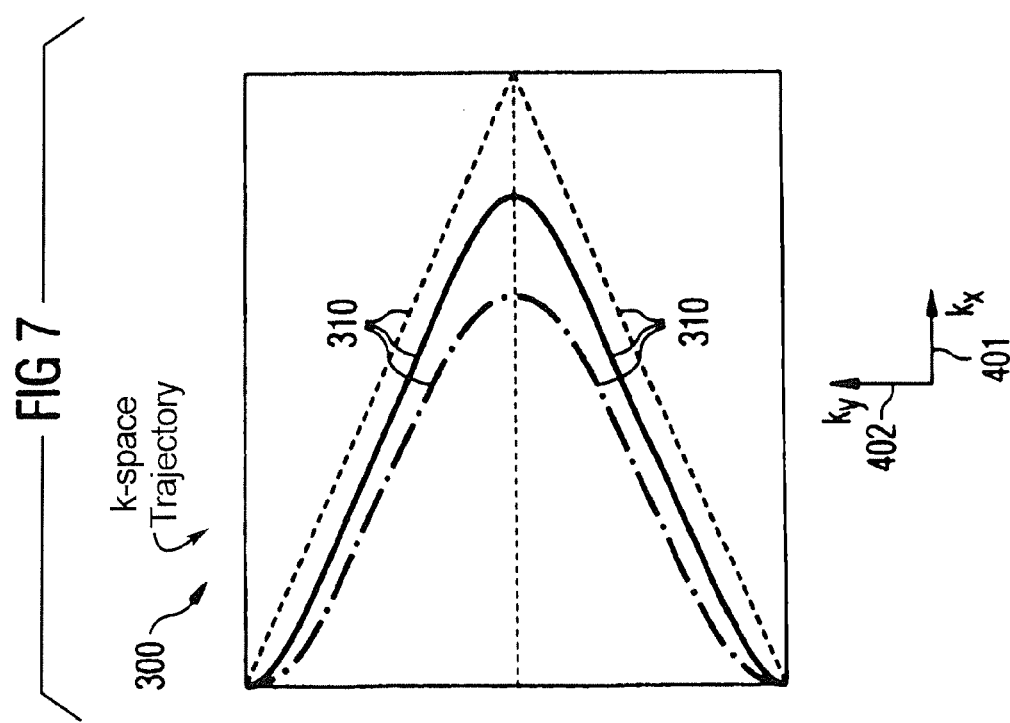
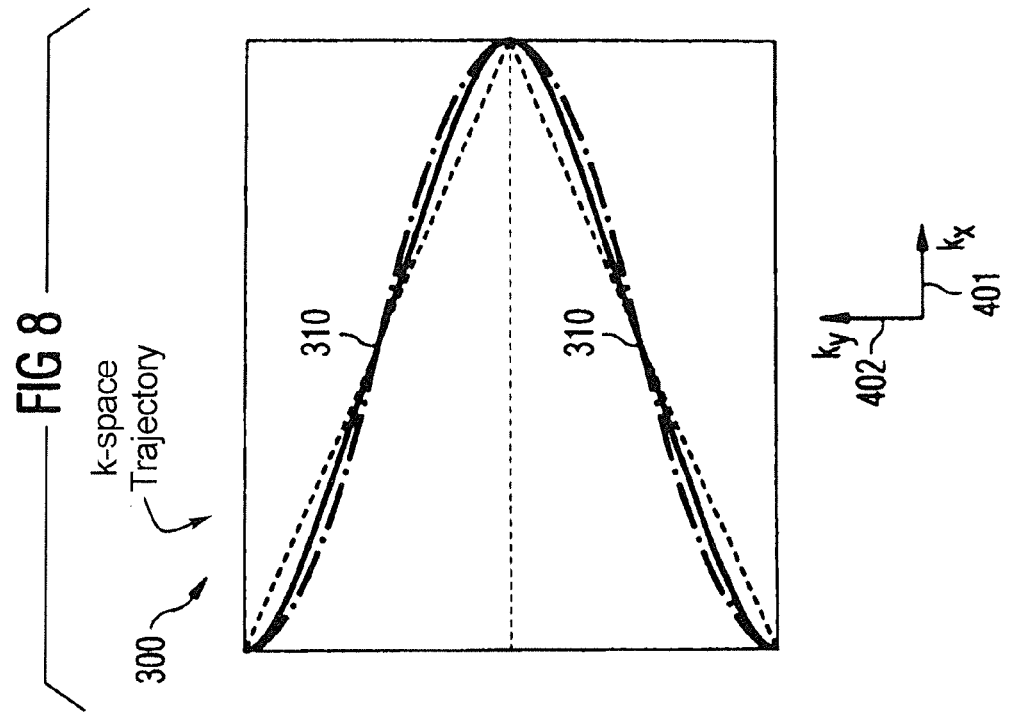

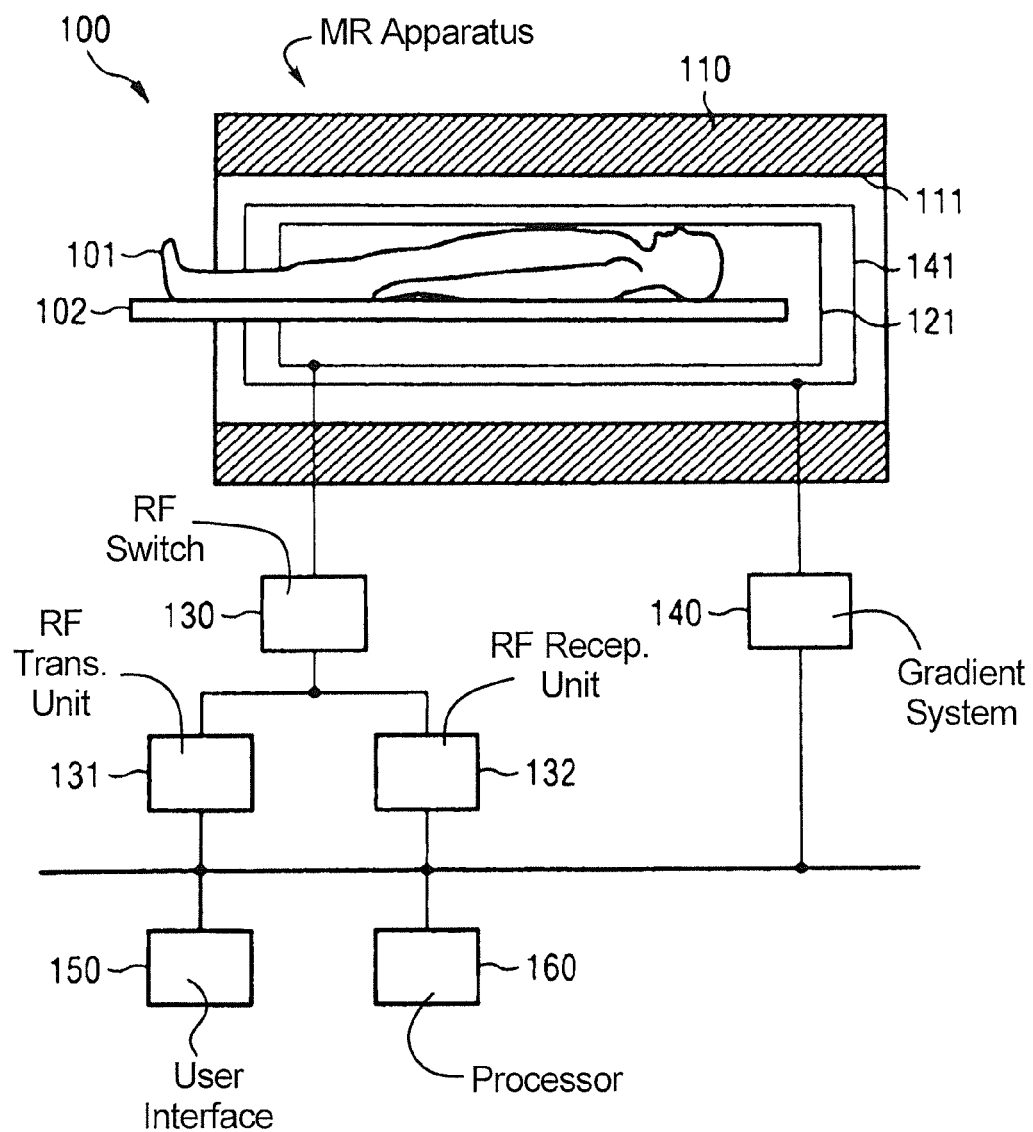

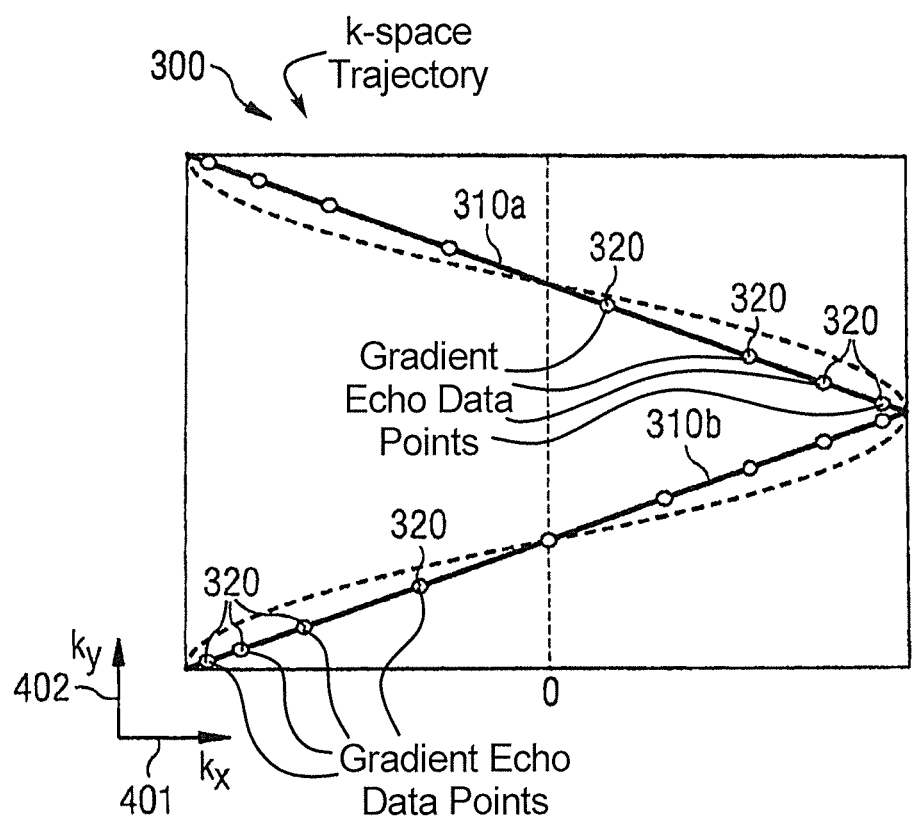

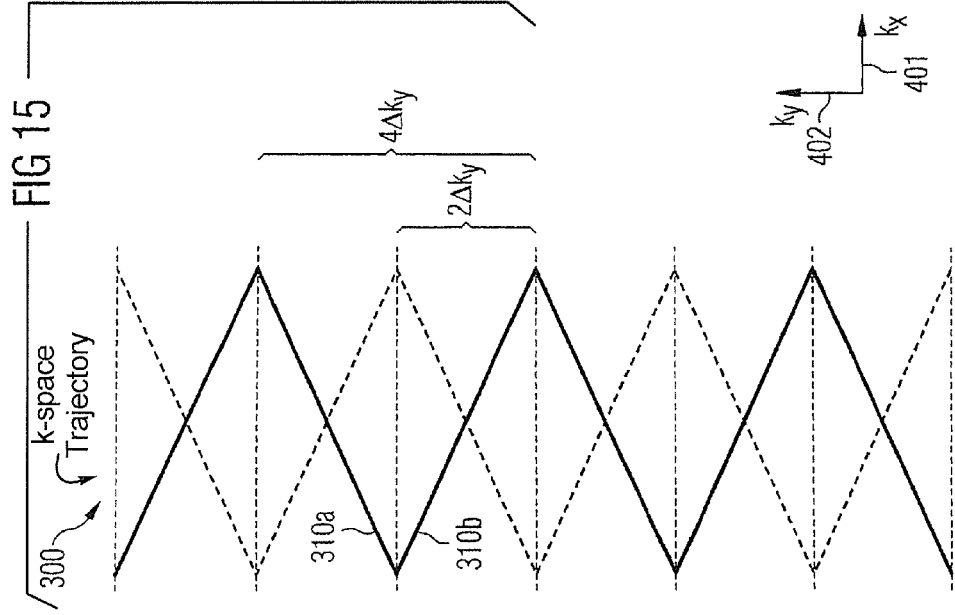
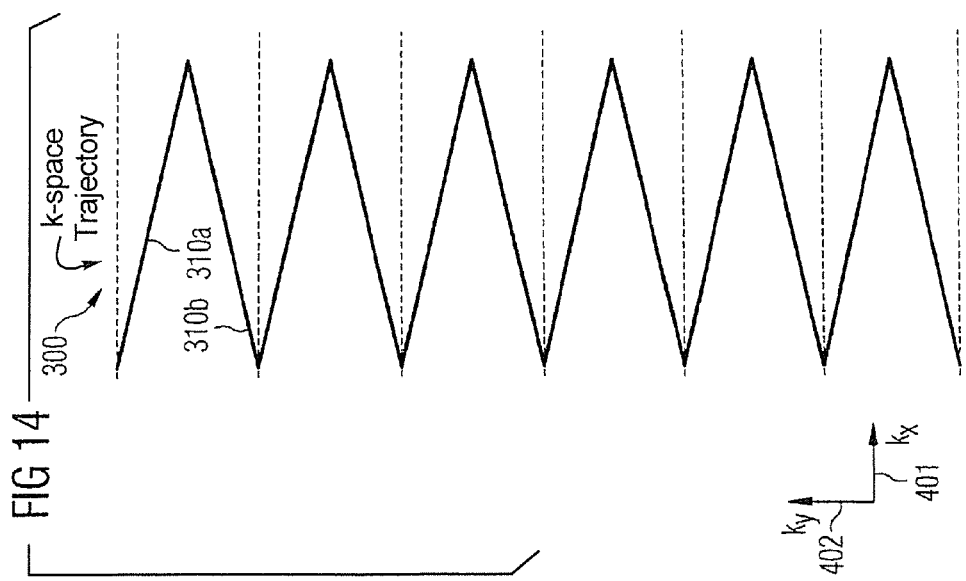

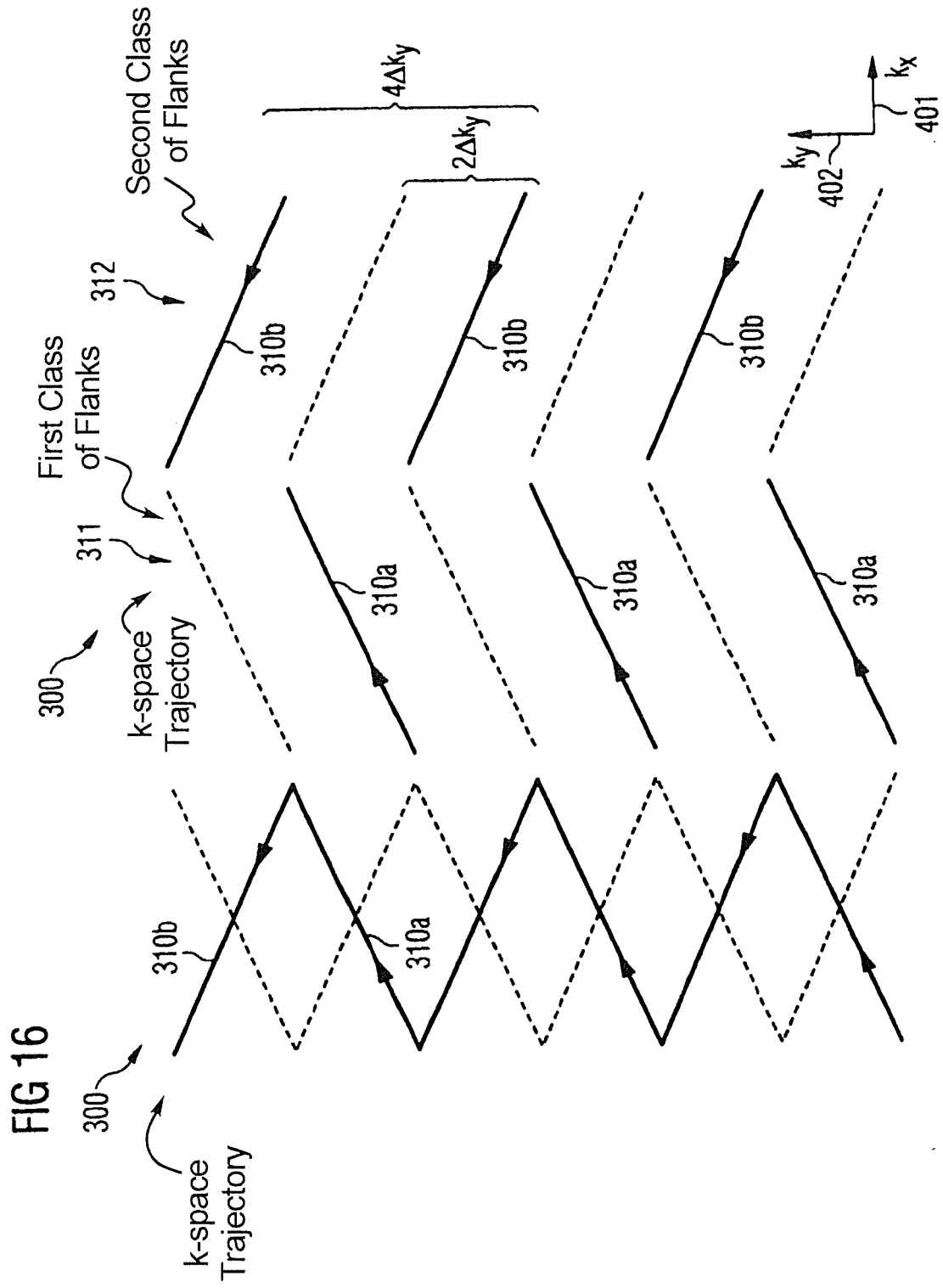

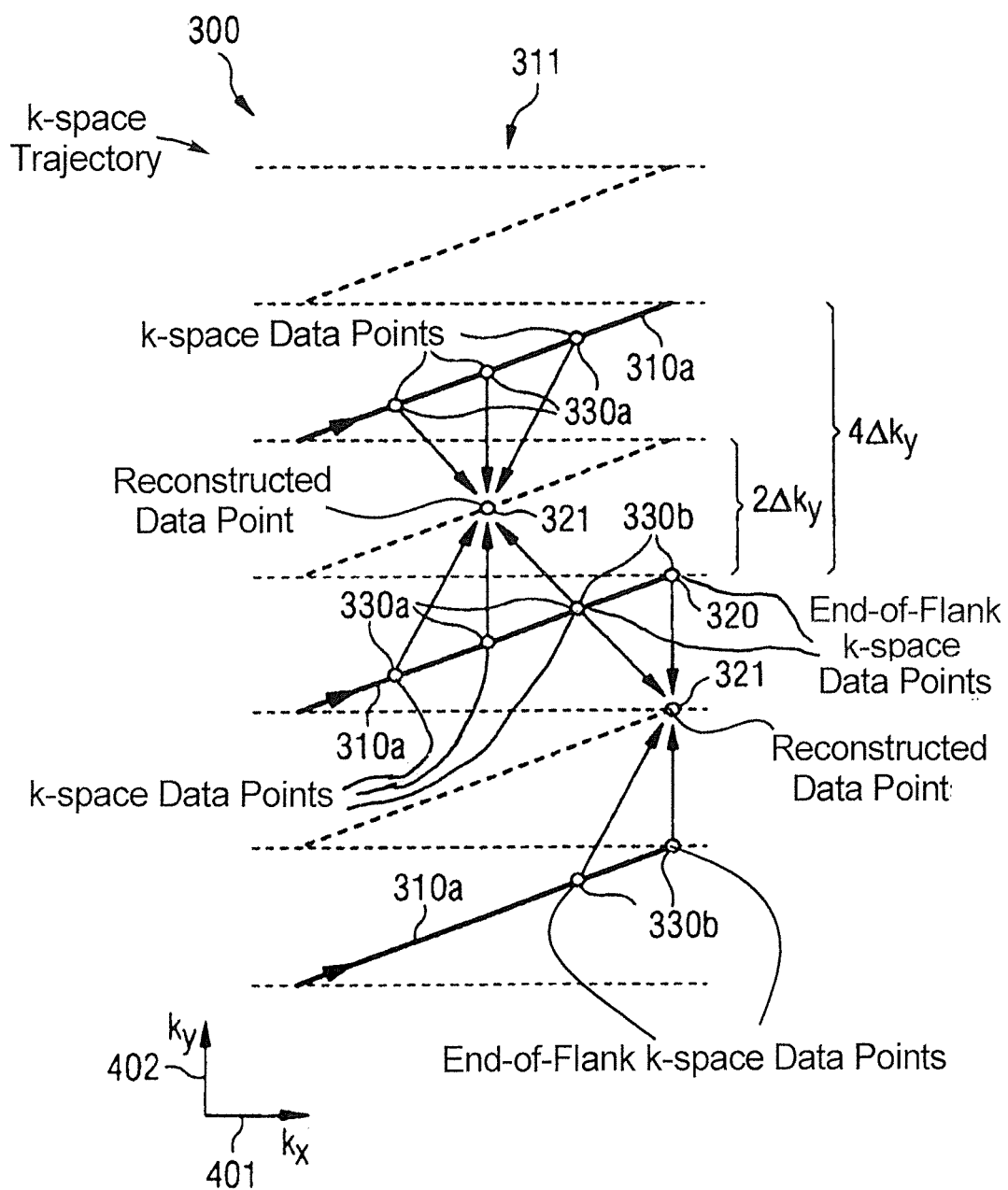

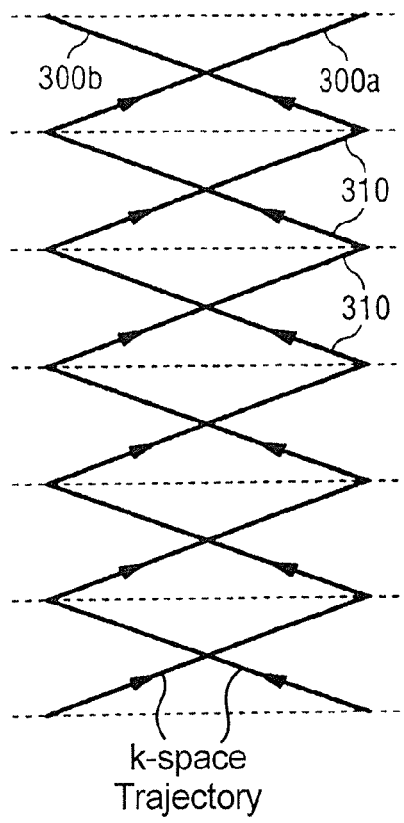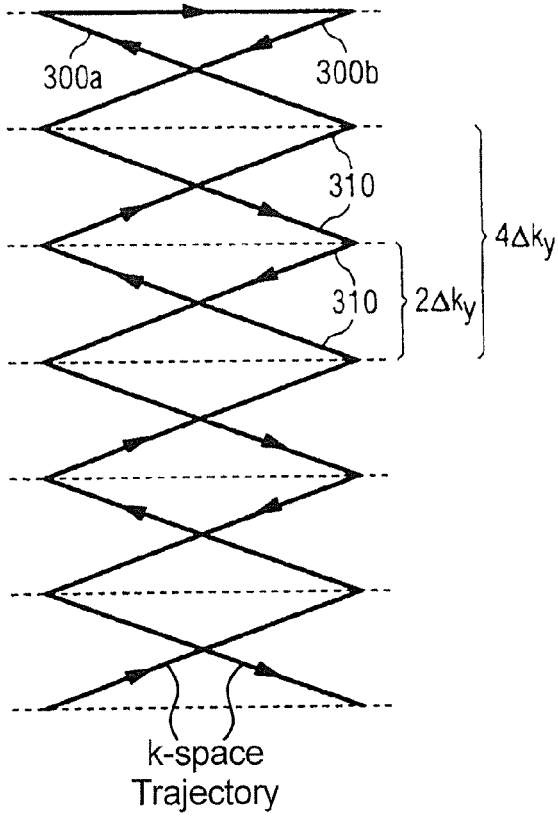

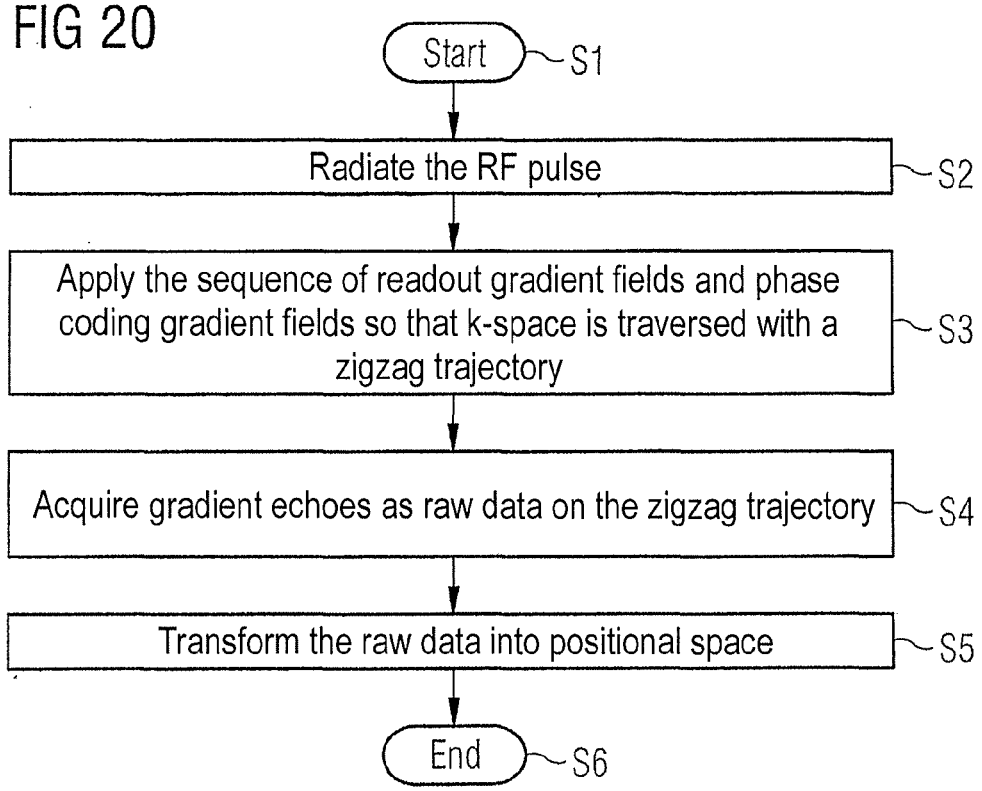
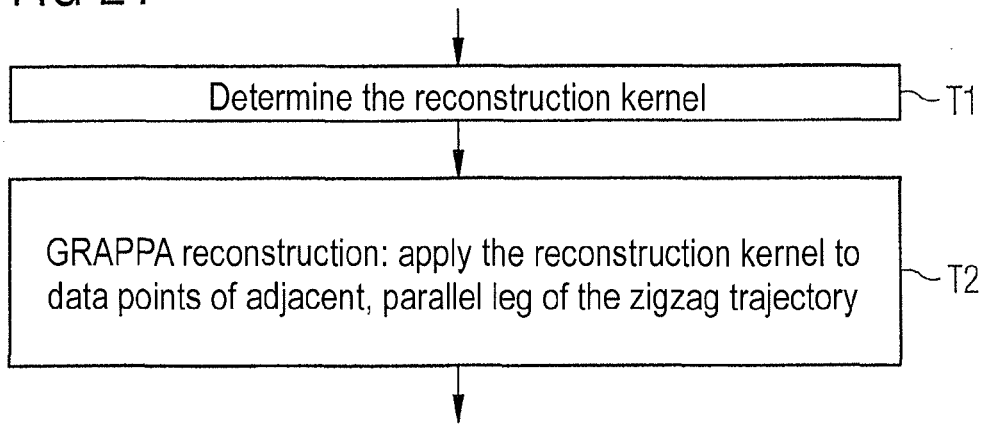

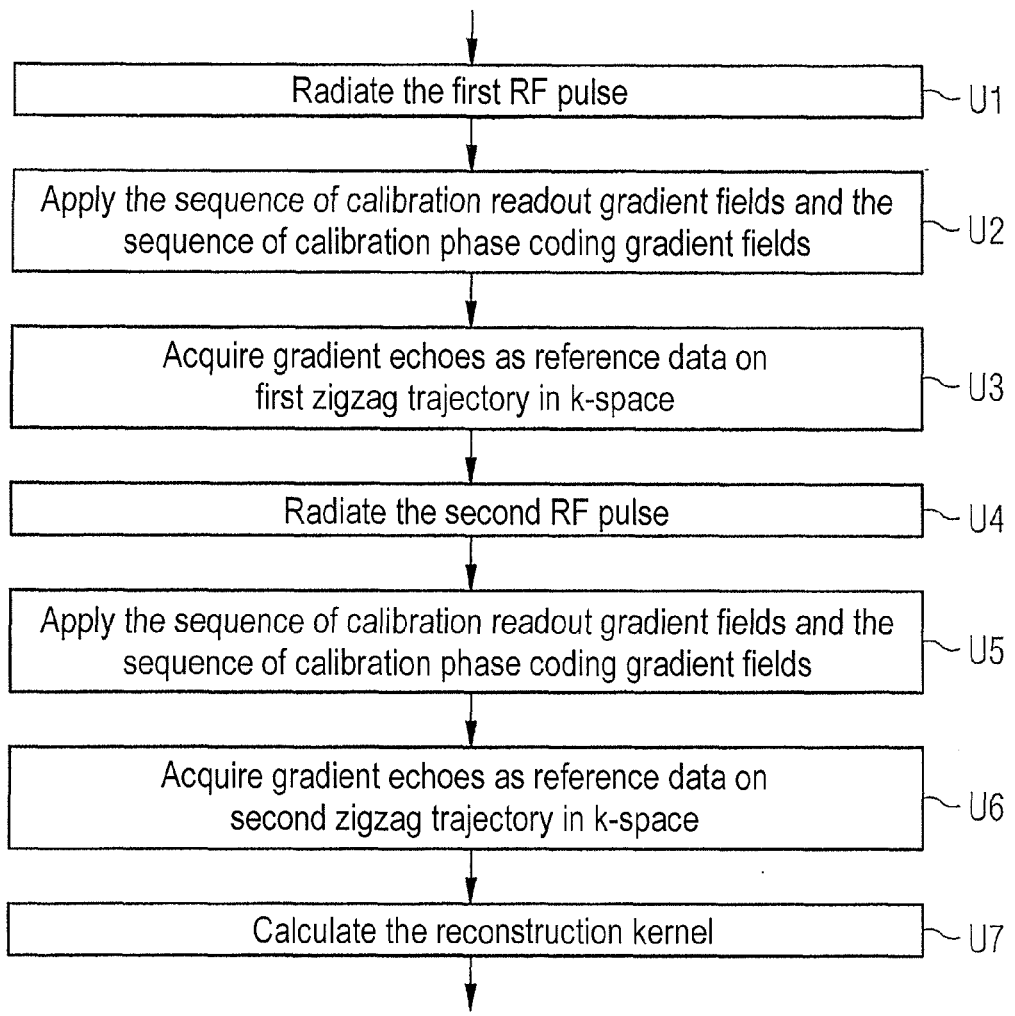

METHOD AND MAGNETIC RESONANCE APPARATUS FOR ECHO PLANAR IMAGING WITH DATA ENTRY INTO K-SPACE ALONG A ZIGZAG TRAJECTORY

BACKGROUND OF THE INVENTION

Field of the Invention

The present invention concerns a method for echo planar magnetic resonance imaging wherein raw data are acquired (entered into k-space) with a zigzag-type trajectory, as well as a magnetic resonance apparatus for implementing such a method. In particular, the invention concerns applying a certain series of phase encoding gradient fields, which enable the zigzag-type trajectory. The invention also concerns techniques for parallel imaging employing the zigzag-type trajectory.

Description of the Prior Art

Magnetic resonance (MR) tomography is an imaging modality that enables acquisition of two-dimensional or three-dimensional image data sets that allow structures in the interior of a patient to be shown in an image with a spatial resolution. MR data are acquired by operating an MR data acquisition unit magnetic to align magnetic moments of protons in a patient in a basic magnetic field or main magnetic field (B0), such that a macroscopic magnetization aligns along a longitudinal direction. This longitudinal magnetization is subsequently deflected from the rest position parallel to the basic magnetic field by irradiating with radio-frequency (RF) pulses (excitation, TX). A transverse magnetization is thereby created. For irradiation of the RF pulses typically dedicated RF transmitter coils of the MR apparatus are employed.

The relaxation of the transverse magnetization back to the rest position, namely the magnetization dynamics, is subsequently detected by employing one or more RF receiver coils of the MR apparatus (imaging, RX). Here a spatial coding of the detected MR data is achieved by applying various magnetic field gradients (for slice selection, phase encoding or frequency encoding). Raw data are acquired in the spatial frequency domain (k-space). By means of a Fourier transformation of the raw data, a MR image in time image or time domain can be obtained. Excitation and imaging are executed as part of a so-called MR measurement sequence.

For imaging, various measurement sequences can be employed. A well-known measurement sequence is the so-called echo planar MR imaging sequence (echo planar imaging, EPI). A tailored dephasing and rephasing of the transverse magnetization for obtaining a so-called gradient echo sequence can occur by applying of gradient fields. For example, by alternation of readout gradient fields of opposite signs, as part of EPI a number of pairs of gradient echoes (gradient echo sequence) can be generated and thereby, by interacting with phase encoding gradient fields, k-space can be sampled (filled at data entry points) for obtaining the raw data.

EPI is in particular employed when fast imaging is desired. Specifically, fast imaging can relate to the time required for obtaining the raw data being relatively short. Aside of this, EPI finds broad application both in clinical fields as well as in neurosciences. Diffusion weighted MRI, which can be used to study nerve links in the brain, and functional imaging for measurement of activation in the brain, are notable examples of the use of EPI.

It is possible for the EPI image quality to be relatively sensitive with respect to so-called susceptibility artifacts and T2* relaxation. Susceptibility artifacts can lead to image distortions that depend, inter alia, on the time between the various echoes of a gradient echo sequence (echo spacing). Further, the T2* relaxation can limit the possible resolution. During readout, the MR signal is typically reduced due to T2* relaxation, i.e., the longer a gradient echo sequence, the stronger the impact of the T2* relaxation on the achievable resolution. Besides these physical limitations, it is also possible for further technical requirements of MR apparatuses and EPI imaging to be comparably demanding. For example, typical EPI sequences impose high demands on the MR apparatus, because a comparably large number of gradient fields are rapidly switched. Mechanical vibrations caused by this can lead to strong noise generation, which not only reduces patient comfort, but also requires a more sophisticated protection for the hearing of the patient (two-fold hearing protection by ear-phones and ear plugs). Further, strong mechanical vibrations can lead to increased wear on the gradient coil and the supply line thereof, which causes increased maintenance costs or even damage to the MR apparatus.

Various techniques are known to reduce challenges and limitations of EPI measurement sequences that are caused by susceptibility effects and T2* relaxation.

For example, by employing certain sampling schemes of k-space, i.e. by employing certain k-space trajectories, an efficient sampling of k-space (acquiring of raw data) can be achieved. It is typical for EPI measurement sequences that the entirety of k-space is read out (filled) after a single excitation of the transverse magnetization. In this respect it can be advantageous to acquire raw data along particularly short k-space trajectories. A shorter k-space trajectory typically results in a shorter gradient echo sequence, i.e. in a reduced T2* relaxation effect.

A further starting point for the reduction of the challenges mentioned above is the use of gradient systems that are configured to create relatively strong gradient fields, i.e., having large amplitudes. Further, the gradient systems can be configured to switch the gradient fields faster, i.e., with a higher slew rate. The time required to switch the gradient fields can thereby be shortened, so the readout time of the EPI sequence can be shortened as well. It can then also be possible to reduce the total duration of the measurement. The total duration also takes into account the readout time and additionally the time required for excitation and potential times of waiting. However, employing of faster and stronger gradient systems is limited by the technological and physiological framework. For example, from a technological point of view, by employing faster and stronger gradient systems, the mechanical stress, e.g., vibrations, and the required amplifier power can increase significantly and reach the limits of technical feasibility. From a physiological point of view, the peripheral nerve stimulation of the patient limits the extent of switching faster and stronger gradient fields.

Further, various techniques known as partial parallel acquisition (PPA) are available, which can be employed as part of the EPI measurement sequence to reduce both the gradient echo sequence as well as the echo spacing and to enhance EPI imaging quality. Such techniques rely on an undersampling of k-space, i.e., the amount entered into k-space for example, certain raw data, k-space rows or k-space points can be left unfilled. By reduction of the amount of raw data, the gradient echo sequence can be shortened (increased resolution) and by skipping data, which are reconstructed later, the effective echo spacing can be reduced by the acceleration factor of the PPA-technique (reduced distortions). Examples for such techniques are Generalized Auto-Calibrating Partial Parallel Acquisition (GRAPPA), Sensitivity Encoding (SENSE), Simultaneous Acquisition of Spatial Harmonics (SMASH) imaging techniques and Sensitivity Profiles from an Array of Coils for Encoding and Reconstruction in Parallel (SPACE RIP).

The method employed most commonly at the moment, GRAPPA, brings about the advantage of a self-calibrating method and operating on completely clean raw data, (k-space data). In GRAPPA, an inversion of a relatively small matrix for determining the reconstruction parameters (reconstruction kernel) is required. The reconstruction kernel needs to be adapted to a particular sampling scheme (with which k-space is undersampled). The distance between data points that are used for the reconstruction (source points) and the data points to be reconstructed (target points) needs to be fixed. This is typically the case for so-called Cartesian trajectories (equally spaced distance). With a zigzag-type trajectory for acquisition of the raw data, the distances between neighboring data points are not constant anymore. Therefore, a direct application of PPA techniques such as GRAPPA is not possible or only possible to a limited degree. More sophisticated non-Cartesian PPA techniques, due to their increased complexity, such techniques have not been adopted for regular clinical use.

Therefore, a need exists for optimized techniques of EPI imaging. In particular, a need exists for such techniques that achieve a shortened readout time and a shortened echo spacing, whereby the image quality can be enhanced. Further, a need exists for such techniques with limited technological and physiological stress due to gradient fields.

SUMMARY OF THE INVENTION

These needs are satisfied in a method of echo planar MR imaging according to the invention wherein the raw data are acquired with a zigzag-type trajectory that much more closely conforms to a true or idealized zigzag than has been achievable by conventional techniques.

The method according to the invention includes radiating an RF pulse for creation of a transverse magnetization of nuclear spins in an examination subject. The method further includes applying a sequence of readout gradient fields that is configured such that the readout gradient fields have alternating positive and negative values. The method further includes applying a sequence of phase encoding gradient fields that is configured such that the phase encoding gradient fields only have positive or only have negative values, continuously increment or decrement the phase of the transverse magnetization as a function time and have values that vary as a function of time. By applying such a sequence of readout gradient fields and such a sequence of phase encoding gradient fields, a zigzag-type trajectory of data entry into k-space is achieved. The method further includes acquiring gradient echoes resulting from the transverse magnetization while applying the sequence of readout gradient fields, and the sequence of phase encoding gradient fields as the raw data along the zigzag-type trajectory.

In other words: the sequence of phase encoding gradient fields can be configured such that the phase encoding gradient fields only have values with the same sign and, e.g., zero; a derivative of the phase of the transverse magnetization with respect to time can have only values with the same sign as a function of time.

For example, the transverse magnetization can relate to a component of the magnetization perpendicular to the basic magnetic field of the MR apparatus. A longitudinal magnetization can relate to a component parallel to the basic magnetic field. Radiating the RF pulse thus causes the magnetization to be deflected from its rest position along the longitudinal direction.

By the excitation of the transverse magnetization, it is possible to execute MR imaging of an object of interest, for example of a patient. The method can further include transforming the acquired raw data to image domain to obtain a MR image that depicts the object of interest. The transforming can be achieved by a Fourier transformation, for example. Techniques are known to those skilled in the art such that there is no need to describe further details herein.

In this respect, the transforming of the data points from the spatial frequency domain to the image domain can be done by employing one or more of the following techniques: interlaced Fourier transformation, re-gridding of the data points to a regular Cartesian grid in the spatial frequency space, and bunched phase encoding.

The trajectory in k-space is a path along which data points from the gradient echoes are filled with the raw data. In general, the zigzag-type trajectory can be a steady advancing of the trajectory in the phase encoding direction and an oscillation of the trajectory between two extremes along the readout gradient direction.

For example, the direction of the readout gradient field can be the $k_x$-direction in k-space. For example, the direction of the phase encoding gradient field can be the $k_y$-direction in k-space.

Further, more specific criteria for the zigzag-type trajectory do not have to be fulfilled. In various scenarios, however, this is possible. In various scenarios the zigzag-type shape of the trajectory can be a trajectory exhibiting a steady change, namely a steady advancing both in $k_x$-direction and in the $k_y$-direction, and further can proceed substantially straight, i.e., so as to have a constant derivative $\Delta y/\Delta x$. In other words, the flanks of the zigzag-type trajectory can have no or no significant curvature. In particular, this is in contrast to Cartesian sampling, wherein so-called blipped phase encoding gradient fields are employed that increment the phase in a discontinuous manner only at the end of each k-space row, and wherein rectangular readout gradient fields with finite shoulders are used.

As noted by applying the sequence of readout gradient fields and the sequence of phase encoding gradient fields, it is possible to implement the zigzag-type trajectory. In this respect "applying" means, for example, the time-coordinated, respectively combined activation of the readout gradient fields and the phase encoding gradient fields. This can be implemented by a central control that operates a gradient system. The amplitudes of the phase encoding gradient fields and the readout gradient fields at a given point in time can thereby, e.g., define the inclination of the trajectories with respect to the direction of the phase encoding gradient fields and the direction of the readout gradient fields, e.g., in a constant manner for neighboring positions in k-space or in a variable manner as a function of the position in k-space. The sequence of the readout gradient fields (the phase encoding gradient fields) can be a temporal succession of the readout gradient fields (of the phase encoding gradient fields).

The values of the phase encoding gradient fields varying as a function of time means, in other words, that a derivative of an amplitude of the phase encoding gradient fields with respect to time has values different from zero. In general it is not required that this derivative is continuous as a function of time.

The continuously incrementation of the phase of the transverse magnetization as a function of time by means of the phase encoding gradient fields can, in other words, mean that the phase encoding gradient fields continuously have, without significant temporal interruptions, values different from zero. However, it should be understood that this does not mean that the phase encoding gradient fields must be described by a function without zero crossings. Rather, this is in particular in contrast to known blipped EPI, where intermittent short phase encoding gradient fields discontinuously increment the phase of the transverse magnetization as a function of time, i.e., in a discrete manner.

By employing a sequence of phase encoding gradient fields that are configured such that the phase encoding gradient fields continuously increment the phase of the transverse magnetization as a function of time, the acquisition of the raw data can be improved. In the technique subject to the present invention, raw data are continuously acquired that cover (fill) the entirety of k-space. Further, the effective strength of the gradient fields can be increased by simultaneously employing two independent gradient coils, e.g., for the phase encoding gradient and the oscillating readout gradient fields. In view of the physiological impact of the switched gradient fields on the patient (peripheral nerve stimulation), this can be an advantage.

As a further effect, by employing phase encoding gradient fields that continuously increment the phase of the transverse magnetization, slower switching times—in particular compared to the short gradient pulses of blipped EPI—can be achieved. The noise formation during the EPI measurement sequences thus can be reduced and vibrations that impose mechanical stress on the MR apparatus can be reduced. This can increase the comfort of the patient.

The sequence of readout gradient fields and the sequence of phase encoding gradient fields can be synchronized in time such that the trajectory of the transverse magnetization proceeds in a zigzag-type path having substantially linear flanks.

By employing the specific sequence of gradient fields, a flexible and optimized control of the zigzag-type trajectory can be achieved. For example, it is possible to select the sequence of gradient fields such that a zigzag-type trajectory is achieved that has an almost ideal zigzag-type form, e.g., the inclination of the flanks of the zigzag-type trajectory has values that are as constant as possible. In other words, any curvature of the flanks that may exist can be particularly small or even go toward zero (linear flanks).

This is particularly relevant when compared to prior art techniques that theoretically attempt EPI imaging having zigzag-type trajectories; see, e.g., EP 0 300 283 B1 (Sekihara et al.) Although in this publication idealized rectangular readout gradient fields (square-wave gradients, arbitrarily short shoulders of the readout gradient fields) are assumed, this is not possible in practice or only possible to a limited degree. In practice, only gradient fields having limited switching times can be achieved. Therefore, instead of the ideal rectangular readout gradient fields, trapezoidal readout gradient fields can in fact develop. In such a case, significant deviations from a zigzag-style trajectory can develop, in particular the trajectory can have a non-negligible curvature of the flanks.

The sequence or readout gradient fields can be configured such that the readout gradient fields have values that are described by a first time-dependent function. The sequence of phase encoding gradient fields can be configured such that the phase encoding gradient fields have values that are described by a second time-dependent function. Here the second time-dependent function can equal the absolute value of the first time-dependent function multiplied by a scaling factor.

For example, the scaling factor can be the ratio of the amplitudes of the phase encoding gradient fields with respect to the amplitudes of the readout gradient fields. For example, the scaling factor can have values between 0 and 1. The scaling factor can, for example, correlate directly with an inclination of the trajectory in k-space. For example, a larger (or smaller) scaling factor can result in the inclination of the trajectory being larger (or smaller).

The scaling factor can also have negative values. This can be the case, for example, for various orientations of the trajectory in k-space.

By setting the second time-dependent function to equal the absolute value of the first time-dependent function, an inherent temporal synchronization between the sequence of the readout gradient fields and the sequence of the phase encoding gradient fields can be achieved.

This can allow a well-defined trajectory to be achieved, e.g., having a given inclination. Also a trajectory can be achieved that is close to the ideal zigzag shape.

The sequence of readout gradient fields and the sequence of phase encoding gradient fields can be synchronized in time such that the maximum values of the phase encoding gradient fields are temporally coincident with the extreme values of the readout gradient fields and/or such that the zero crossings of the values of the phase encoding gradient fields are temporally coincident with the zero crossings of the values of the readout gradient fields.

Extreme values can be, e.g., maximum values and minimum values of the gradient fields.

In general, various functions can be selected that describe the values of the readout gradient fields and the phase encoding gradient fields as a function of time. Possible functions are, e.g., trapezoidal functions and/or trigonometric functions and/or polynomial functions.

The sequence of readout gradient fields can be configured, for example, such that the readout gradient fields have values that are described by a sinusoidal-type time-dependent function. The sequence of phase encoding gradient fields can be configured such that the phase encoding gradient fields have values that are described by an absolute value of the sinusoidal-type function multiplied by a scaling factor.

In such a case a zigzag-type trajectory can be achieved that consists of two classes of flanks, namely such that the flanks have an inclination equal to a positive predefined value and such that the flanks have an inclination equal to a predefined value multiplied by −1 (negative predefined value). In other words, the trajectory can be particularly close to the ideal zigzag shape where the flanks are linear and therefore each has a constant inclination.

In other words, the zigzag-type trajectory can be achieved by simultaneously employing sinusoidal readout gradient fields and sinusoidal phase encoding gradient fields. However, here only the positive half-wave of the phase encoding gradient field can be applied so a continuous movement in $k_y$-direction in k-space can result.

By employing the sequence of readout gradient fields and phase encoding gradient fields which are configured such that the values of the readout gradient fields and the phase encoding gradient fields vary as a function of time, in general the speed with which the trajectory is sampled while acquiring the raw data can vary as a function of time, namely as a function of the position in k-space. This can be the case, as described above, when the value of the readout gradient fields and/or the value of the phase encoding gradient fields relates to the incremental change of the phase as a function of time.

For example, the sequence of readout gradient fields and/or the sequence of phase encoding gradient fields can be configured such that a density of data points of the acquired raw data along the trajectory has periodically varying values.

For example, the density of data points of the acquired raw data along the trajectory can be inversely proportional to the distance of neighboring data points along the trajectory. If neighboring data points, i.e., data points which are acquired in immediate succession, have a larger distance to each other along the trajectory (have a smaller distance to each other), the density of data points of the acquired raw data can be smaller (larger). In this example the density of data points would be defined in a one-dimensional manner, namely along the trajectory; however, it would also be possible to define the density of data points in a two-dimensional manner (e.g., in the xy-plane) or in a three-dimensional manner.

The sequence of readout gradient fields and/or the sequence of phase encoding gradient fields can be configured such that the density of data points of the acquired raw data along the trajectory has larger values for larger distances along the readout gradient direction to a center of the spatial frequency space than for smaller distances.

Larger distances along the readout gradient direction to a spatial frequency space center relate to, in other words: larger absolute values of the x component of the k-space vector.

Techniques have been described above that enable certain well-defined zigzag-type trajectories, in particular such trajectories that have linear flanks. Hereinafter predominantly techniques are described that enable parallel MR imaging for zigzag-type trajectories.

According to a further aspect the invention concerns a method of echo planar MR imaging wherein the raw data are acquired with a zigzag-type trajectory. The method includes radiating an RF pulse to create a transverse magnetization of nuclear spins in an examination subject. The method further includes applying a sequence of readout gradient fields that is configured such that the readout gradient fields have alternating positive and negative values. The method further includes applying a sequence of phase encoding gradient fields which is configured such that the phase encoding gradient fields have only positive or only negative values and, as a function of time, continuously increment or decrement the phase of the transverse magnetization. The sequence of readout gradient fields and the sequence of phase encoding gradient fields are configured such that a zigzag-type trajectory is achieved that has a first class of flanks having positive values of the readout gradient fields and a second class of flanks having negative values of the readout gradient fields. The method further includes acquiring gradient echoes resulting from the transverse magnetization during the application of the sequence of readout gradient fields and the sequence of phase encoding gradient fields for data points of the raw data along the zigzag-type trajectory, using multiple receiver coils, and the applying of a parallel MR image reconstruction algorithm to the acquired data points in order to obtain an image data set representing the region of the examination subject in which the nuclear spins were given the transverse magnetization.

For example, reconstruction can occur in the image domain or the spatial frequency domain. An example of a method for reconstruction in the image domain is SENSE. An example of a method for reconstruction in the spatial frequency domain is GRAPPA. The basic techniques for various methods of reconstruction in parallel MR imaging are known to those skilled in the art, such that no further details are needed herein.

The first class of flanks of the zigzag-type trajectory can be data points read out during readout gradient fields having positive value. The second class of flanks of the zigzag-type trajectory can be data points read out during readout gradient fields having negative values. The inclination of the zigzag-type trajectory in the spatial frequency domain with respect to the readout gradient field direction has positive values for the first class of flanks and has negative values for the second class of flanks. It should be understood that it is not necessary that the zigzag-type trajectory to have flanks that are precisely linear, i.e., that have no or only a small curvature, but this is of advantage in various case. For this purpose, it is possible, e.g., to apply techniques as described above with respect to the method of echo planar magnetic resonance imaging according to a further aspect of the present invention.

As an example, the flanks belonging to the first class of flanks can be arranged in an alternating manner with flanks that belong to the second class of flanks. The end point of a preceding flank, e.g., of the first class, can be coincident or substantially coincident with the starting point of a succeeding flank, e.g., of the second class.

Neighboring flanks of the same class can be e.g., parallel flanks that have the shortest distance in k-space within the same class of flanks to each other. It should be understood that between two neighboring flanks of the same class, further flanks of the other class of flanks can be situated.

Because neighboring flanks of the same class proceed in parallel with respect to each other and preferably have no or only a small curvature, it can be possible to use simple known methods for parallel MR image reconstruction, e.g., with respect to Cartesian k-space trajectories. This is because trajectories in Cartesian k-space sampling can be characterized as sampling k-space row-by-row so neighboring rows proceed in parallel with respect to each other and are linear, i.e., each has a constant y value of the k-vector.

By structuring of the trajectory with the first and second class of flanks, an application of simple Cartesian PPA methods for reconstruction is made possible.

As noted, an example of such a method for reconstruction for parallel imaging in the image domain is SENSE. It is possible to apply a Fourier transformation to neighboring parallel flanks from the spatial frequency domain to the image domain in order, e.g., to obtain MR images having foldover artifacts, e.g. with basic foldovers. By means of known Cartesian SENSE techniques of reconstruction it would then be possible to reconstruct the data, to suppress the foldover artifacts, i.e., to remove them.

The reconstruction for parallel MR imaging can be applied to the acquired raw data in the spatial frequency domain and can operate in multiple data points of the acquired raw data that are situated on neighboring flanks of the same class.

It is then possible for the multiple reconstructed data points to form a reconstructed flank that belongs to the same class as the underlying multiple acquired data points.

In other words, the reconstructed flank that is formed by multiple reconstructed data points can be situated in parallel to the neighboring flanks of the same class that include the acquired raw data from which the reconstructed flank is reconstructed. For example, if the reconstructed flank is reconstructed from two neighboring flanks of the first class (or second class), then the reconstructed flank can also belong to the first class (or second class).

The method for reconstruction in parallel MR imaging can employ at least one reconstruction kernel, with a given dimension.

The at least one reconstruction kernel can then be applied to a number of acquired data points. Such techniques are in principle known to the person of ordinary skill, e.g., with respect to GRAPPA, the k-space based techniques which predominantly find application in the present case.

In various scenarios it is for example possible to apply a single reconstruction kernel to the number of data points on the neighboring flanks of the same class for the reconstruction of the plurality of reconstructed data points. The reconstruction kernel preferably has dimensions of 2×3, i.e., a reconstructed data point is calculated from 2×3=6 data points of the acquired raw data in total. At the edges of the acquired flanks of the first and/or second class it can then be possible to discard individual data points after reconstruction, such that the reconstructed flank and the acquired flanks of the raw data have the same dimension.

It is also possible, for those reconstructed data points that are not situated adjacent to the ends of the reconstructed flanks, to use a first reconstruction kernel having a first dimension, and for those reconstructed data points that are situated adjacent to the ends of the reconstructed flank, to use a second reconstruction kernel having a second dimension, wherein the first dimension is larger than the second dimension. In such a case it may not be necessary to discard individual data points of the raw data.

The method can further include determining the at least one reconstruction kernel. The determination of the at least one reconstruction kernel can include applying of a sequence of calibration readout gradient fields that is configured such that the calibration readout gradient fields have alternating positive and negative values, and applying a sequence of calibration phase encoding gradient fields that is configured such that the calibration phase encoding gradient fields only have positive or only have negative values and continuously increment or decrement the phase of the transverse magnetization as a function of time. The sequence of calibration readout gradient fields and the sequence of calibration phase encoding gradient fields can be configured to obtain a first zigzag-type calibration trajectory and a second zigzag-type calibration trajectory that each consist of a first class of flanks having positive values of the calibration readout gradient field and a second class of flanks having negative values of the calibration readout gradient field. An inclination of the flanks that are acquired with the sequence of calibration readout gradient fields and the sequence of calibration phase encoding gradient fields can equal an inclination of the flanks that are acquired with the sequence of readout gradient fields and a sequence of phase encoding gradient fields. The determination of the at least one reconstruction kernel can further include acquiring calibration gradient echoes of the transverse magnetization during the application of the sequence of calibration readout gradient fields and the sequence of calibration phase encoding gradient fields for data points along the first zigzag-type calibration trajectory and along the second zigzag-type calibration trajectory, and calculating the at least one reconstruction kernel from data points on neighboring parallel flanks of the first and second zigzag-type calibration trajectories.

Typically the obtained raw data for the determining of the reconstruction kernel are referred to as reference data or ACS (Auto-Calibration Signal) data. As part of the determination of the at least one reconstruction kernel, k-space can be sampled multiple times, namely with a first calibration trajectory and a second calibration trajectory. In general, further calibration trajectories are possible. This can have the effect that an integral density, e.g., a two-dimensionally defined density of the data points that are acquired with the calibration trajectories, is larger by an acceleration factor than a respective integral density of the data points that are acquired with the diagnostic trajectory (the trajectory used for the data that are reconstructed to form an image used to make a diagnosis). In the case of the first and second calibration trajectories the density of the data points, thus the acceleration factor, can be two, for example.

The two-fold or multiple sampling of k-space as part of the determination of the at least one reconstruction kernel can occur from a single or multiple excitations of the nuclear spins to create the transverse magnetization.

For example, a first flank of the first zigzag-type calibration trajectory and a second flank of the second zigzag-type calibration trajectory, which are neighboring in the spatial frequency domain and proceed in parallel with respect to each other, can each have data points that are acquired with positive values or with negative values of the calibration readout gradient fields.

With a two-fold excitation (for example) of the transverse magnetization, i.e., two radiations of an RF pulse, it can be achieved that parallel and neighboring first and second flanks have the same sign of the respectively associated calibration readout gradient fields.

In such a scenario, phase differences caused by changing direction of the readout gradient fields can be avoided in the reference data that are employed for the determining of the reconstruction kernel. Errors and uncertainties in the determining of the reconstruction kernel thus can be reduced. It is possible that small errors in the temporal synchronization of the various components of the MR apparatus, in particular of the gradient system and the radio-frequency components, can cause a dependency of the reference data, as well as the raw data, on the inclination of the calibration trajectory, or the diagnostic trajectory, dependent on the sign. Therefore, it can be desirable to acquire parallel flanks of the calibration trajectory having the same sign as the readout gradient fields.

The invention also encompasses an MR apparatus designed to acquire raw data having a zigzag-type trajectory. The MR apparatus has at least one radio-frequency coil that is configured to radiate a radio-frequency pulse to give nuclear spins in an examination subject a transverse magnetization, and a gradient system that is configured to apply a sequence of readout gradient fields having alternating positive and negative values, and to apply a sequence of phase encoding gradient fields that only have positive or only have negative values and that continuously increment or decrement the phase of the transverse magnetization as a function of time, and that have values which vary as a function of time. By applying the sequence of readout gradient fields and the sequence of phase encoding gradient fields, the zigzag-type trajectory is achieved. The MR apparatus further has a radio-frequency receiver unit that is configured to acquire gradient echoes resulting from the transverse magnetization during the application of the sequence of readout gradient fields and the sequence of phase encoding gradient fields, as raw data along the zigzag-type trajectory.

Such an MR apparatus achieves results and advantages that are comparable to those achieved with the method of echo planar MR imaging according to the present invention, as described above.

The present invention also encompasses an MR apparatus designed for EPI, wherever EPI raw data are acquired with a zigzag-type trajectory. The MR apparatus has at least one radio-frequency coil that is configured to radiate a radio-frequency pulse to give nuclear spins in an examination subject a transverse magnetization, and a gradient system that is configured to apply a sequence of readout gradient fields, having alternating positive or negative values, and to apply a sequence of phase encoding gradient fields that only have positive or only have negative values and that continuously increment or decrement the phase of the transverse magnetization as a function of time. The sequence of readout gradient fields and the sequence of phase encoding gradient fields are configured to achieve a zigzag-type trajectory, which has a first class of flanks having positive values of the readout gradient fields and a second class of flanks having negative values of the readout gradient fields. The MR apparatus further has a radio-frequency receiver having multiple receiver coils that acquire gradient echoes resulting from the transverse magnetization during the application of the sequence of readout gradient fields and the sequence of phase encoding gradient fields, as data points of raw data along the zigzag-type trajectory. The MR apparatus further has a processor configured to apply a parallel MR imaging reconstruction algorithm to the acquired data points.

Such an MR apparatus achieves results and advantages that are comparable to those achieved with the method for echo planar MR imaging according to the present invention, as described above.

Features mentioned above and features that are described hereinafter can not only be employed in the respective explicitly illustrated combinations, but also in further combinations or in isolation, without departing from the scope of protection of the present invention. In particular, it is possible to combine the methods of echo planar MR imaging according to various aspects with each other.

BRIEF DESCRIPTION OF THE DRAWINGS

FIG. 1 illustrates a known sequence of readout gradient fields and of phase encoding gradient fields of a blipped EPI measurement sequence for MR imaging.

FIG. 2 illustrates a known sequence of readout gradient fields and of phase encoding gradient fields of an EPI measurement sequence having a constant phase encoding gradient field.

FIG. 3 illustrates a known sequence of readout gradient fields and of phase encoding gradient fields of an EPI measurement sequence having a constant phase encoding gradient field and a sinusoidal shaped readout gradient field.

FIG. 4 illustrates a Cartesian trajectory in k-space for the measurement sequence of FIG. 1.

FIG. 5 illustrates a zigzag-type trajectory in k-space for the measurement sequence of FIG. 2, as well as a zigzag-type reference trajectory.

FIG. 6 illustrates a zigzag-type trajectory in k-space for the measurement sequence of FIG. 3, as well as a zigzag-type reference trajectory.

FIG. 7 is a comparison of the trajectories of FIGS. 5 and 6.

FIG. 8 is the comparison of FIG. 7, wherein the trajectories are shown in a normalized manner.

FIG. 9 is a schematic illustration of an MR apparatus according to various embodiments of the present invention, which is suited to execute techniques according to various embodiments of the present invention.

FIG. 13 illustrates a trajectory in k-space for the measurement sequence of FIG. 12, wherein further data points of raw data along the trajectory are illustrated.

FIG. 14 is a further view of the trajectory of FIG. 13, wherein multiple k-space rows are illustrated.

FIG. 15 illustrates a trajectory in k-space for the measurement sequence of FIG. 12 wherein, in contrast to FIG. 13, a different scaling factor between the values of the phase encoding gradient fields and the readout gradient fields is selected.

FIG. 16 illustrates a first class and a second class of flanks for the trajectory of FIG. 15.

FIG. 17 illustrates the reconstructing of reconstructed data points in k-space by applying a reconstruction kernel to neighboring flanks of the first class.

FIG. 18 illustrates first and second calibration trajectories that are suited to determine the reconstruction kernel, wherein two excitations of the transverse magnetization occur.

FIG. 19 illustrates first and second calibration trajectories that are suited to determine the reconstruction kernel, wherein a single excitation of the transverse magnetization occurs.

FIG. 20 is a flowchart of a method of echo planar MR imaging according to various embodiments of the present invention.

FIG. 21 is a flowchart that illustrates steps of the GRAPPA reconstruction with reference to FIG. 20 in greater detail, according to various embodiments of the present invention.

FIG. 22 is a flowchart that illustrates in greater detail various steps for the determination of a GRAPPA reconstruction kernel with reference to FIG. 20, according to various embodiments of the present application.

DESCRIPTION OF THE PREFERRED EMBODIMENTS

Figure 10:
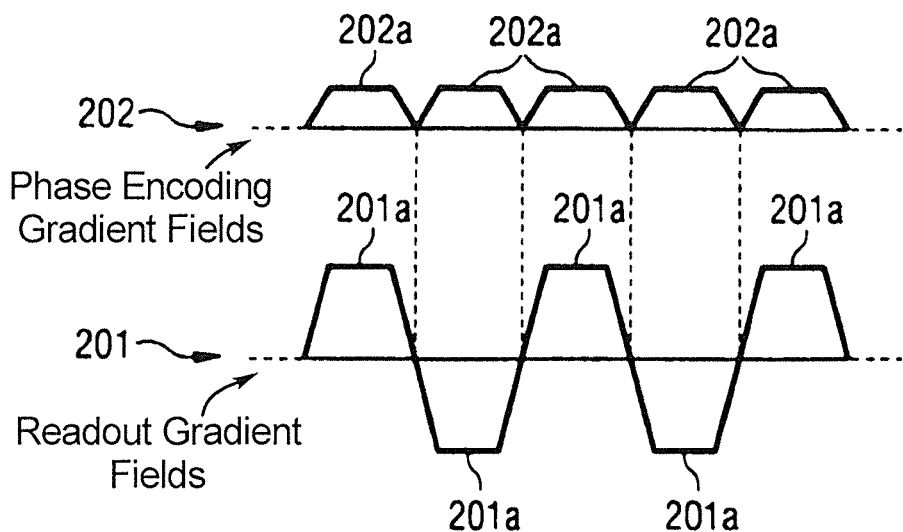
FIG. 10 illustrates a sequence of readout gradient fields and of phase encoding gradient fields of an EPI measurement sequence according to various embodiments of the present invention.

Hereinafter, the present invention is illustrated by means of preferred embodiments and with reference to the drawings. In the figures, like reference numerals denote like elements. In the figures, techniques for EPI MR imaging are described. In general, the techniques according to various embodiments of the present invention allow implementing zigzag-type trajectories having well-defined and specific parameters, e.g., curvature and inclination and/or distance of the flanks, for the acquiring of raw data. In particular, these techniques allow implementing zigzag-type trajectories for the acquiring of raw data which have flanks with comparably small curvature, i.e., particularly linear flanks. Such trajectories are referred to as ideal zigzag-type trajectories hereinafter, wherein it should be understood that particular technically caused deviations, respectively small residual curvatures can be present. Further techniques for the application of PPA methods, i.e., parallel imaging, as in particular GRAPPA or related approaches, to the EPI imaging with zigzag-type trajectories are described.

In FIG. 1, a sequence 201 of readout gradient fields 201a and a sequence 202 of phase encoding gradient fields 202a are illustrated. Prior to applying the first readout gradient field 201a, an RF pulse is radiated that gives nuclear spins, at least in a region of an examination subject, a transverse magnetization according to known techniques.

In EPI imaging, typically the entirety of k-space is sampled by a single excitation of this kind. The sequence 201 of readout gradient fields 201a is configured such that the readout gradient fields 201a have alternating positive and negative values. The sequence 201 of oscillating readout gradient fields 201a thereby leads to a change in the readout direction. By means of short phase encoding gradient fields 202a (blips) having a duration of approximately 100 µs respectively at the end of each k-space row, a jump to the next neighboring k-space row is achieved. As can be seen from FIG. 1, the phase encoding gradient fields only has positive values and increment the phase of the transverse magnetization as a function of time in a discontinuous manner, namely respectively only during the short time during which the amplitude of the phase encoding gradient fields 202a is not equal to zero. The readout direction, however, can also be inverted if the phase encoding gradient fields only has negative values and therefore the phase of the transverse magnetization is continuously decremented as a function of time. In principle, this is a formal matter of the reference coordinate system.

The trapezoidal readout gradient fields 201a can be due to technical limitation and relate to the applied time dependence of principally rectangular readout gradient fields 201a. The shoulder of the readout gradient fields 201a can therefore have a certain minimum duration.

In FIG. 2, an EPI measurement sequence is illustrated where the sequence 202 of the phase encoding gradient fields 202a is configured such that the phase of the transverse magnetization is incremented continuously as a function of time. This is implemented by the phase encoding gradient fields 202a having values that do not vary as a function of time and that are, in particular, constant.

In FIG. 3, a respective EPI measurement sequence is illustrated where the sequence 201 of the readout gradient fields 201a is sinusoidal—in contrast to the trapezoidal sequence 201 of FIGS. 1 and 2.

In case of FIGS. 2 and 3, by the interplay of oscillating readout gradient fields 202a and constant phase encoding gradient fields 202a, it can be achieved that a zigzag-type trajectory is followed in k-space during imaging. In other words, the trajectory is situated on and along a diagonal due to the simultaneously switching of readout and phase encoding gradient fields 202a, 202b.

In FIGS. 4-6, trajectories 300 for the EPI measurement sequence of FIGS. 1-3 are illustrated, respectively along the $k_x$-direction 401 and the $k_y$-direction 402. From FIG. 4 it can be seen that by means of the blipped EPI measurement sequence of FIG. 1 a Cartesian sampling of k-space 300 can occur.

The effort to improve the efficiency of the EPI measurement sequence by employing non-Cartesian trajectories is the basis of the sequences 201, 202 of readout gradient fields 201a and phase encoding gradient fields 202a of FIGS. 2 and 3. As can be respectively seen from FIGS. 5 and 6, these EPI measurement sequences result in zigzag-type trajectories 300.

For the zigzag-type trajectories 300 of FIGS. 5 and 6 the phase of the transverse magnetization is continuously incremented in $k_y$-direction 401—which causes the diagonally running flanks 310 of the trajectories 300. Depending on the choice of the reference coordinate system, the phase can also be referred to as continuously decrementing. As in the case of the Cartesian trajectory 300 the flanks 310 which now relate to the k-space rows extend between maximum and minimum values along the $k_x$-direction 401.

In FIGS. 5 and 6 by means of a dashed line, furthermore an ideal zigzag-shaped reference trajectory is illustrated, i.e., having linear flanks 310 and without curvature. As can be seen from a comparison of the trajectory 300 with the reference trajectory, by means of the EPI measurement sequences of FIGS. 2 and 3 an ideal zigzag-trajectory is not achieved. Rather, the flanks 310 have curvatures. This is illustrated in FIGS. 7 and 8 in greater detail.

In FIG. 7, for direct comparison, the two trajectories 300 of FIGS. 5 and 6 as well as the reference trajectories are illustrated respectively for two flanks 310. In FIG. 7, the trajectory 300 of FIG. 5 is depicted with a solid line, the trajectory 300 of FIG. 6 is depicted with a dashed-dotted line, as well as the reference trajectory which is depicted with a dashed line. FIG. 8 is a view corresponding to FIG. 7, wherein the trajectory 300, as well as the reference trajectories, is shown normalized to 1.

As can be seen from FIGS. 7 and 8, the trajectories 300 of the EPI measurement sequences of FIGS. 5 and 6 significantly deviate from the reference trajectory. They are therefore not ideally zigzag-shaped.

The raw data acquired along the zigzag-type trajectories 300 can be separated into two classes of flanks 310 that respectively include parallel or substantially parallel flanks 310. The flanks 310 of the two classes have the same inclination and an equal distance of $2\Delta k_y$ (cf. FIGS. 5 and 6). By interlaced Fourier transformation, a transformation of the raw data from the spatial frequency space to the real space can occur to obtain a MR image.

Advantages of these zigzag-type trajectories 300 of FIGS. 5-8 are, e.g., reduced measurement duration due to optimized sampling of the k-space. Further, it can be an advantage that constant phase encoding gradient fields 202a are employed, which can reduce vibration and noise formation during execution of the EPI measurement sequence. However, the deviations of the trajectories 300 if compared to the ideal zigzag-type reference trajectory can result in the transformation of the raw data by means of the interlaced Fourier transformation having only a limited accuracy. This can be the case as the respective techniques typically assume the idealized reference trajectory, see e.g. Bracewell, R. N. "Fourier transformation and its application", McGraw-Hill, New York, 1978.

In general, the deviation of the trajectory 300 from the ideal zigzag shape is also not particularly deterministic and, e.g., due to technical fluctuations of the MR apparatus that are not precisely predictable and thus cannot be meaningfully controlled. Therefore, it can be impossible or only possible to a limited degree, to take into account the actual shape of the trajectory 300 for known zigzag EPI MR-imaging when Fourier-transforming the raw data to real space.

Various scenarios and aspects of the invention allow well-defined zigzag-shaped trajectories to be achieved in EPI measurement sequences—in particular trajectories that coincide as well as possible with the ideal zigzag-shaped reference trajectory.

In FIG. 9, first a MR apparatus 100 is illustrated that is configured to execute respective techniques, methods and steps according to various embodiments. The MR apparatus 100 has a magnet 110 that defines a tunnel 111. The magnet 110 can create a basic magnetic field in parallel to a longitudinal axis. An object of interest, here a patient 101, can be slid into the magnet 110 on a table 102. The MR apparatus 100 further has a gradient system 140 for the creation of gradient fields that are used for MR imaging and for spatial encoding of acquired raw data. Typically, the gradient system 140 has at least three separately controllable gradient coils 141 that have a defined position with respect to each other. The gradient coils 141 enable the application and witching of gradient fields along certain directions of space (gradient axis). The respective gradient coils 141 are also referred to as channels of the gradient system 140. The channels can, e.g., define a frequency encoding, a readout encoding, and a phase encoding. Thereby, a spatial resolution of the raw data can be achieved.

For the excitation of the polarization of nuclear spins of the subject so as to cause the magnetization along the longitudinal direction that results in the basic magnetic field, an RF coil arrangement 121 is provided, that can radiate an amplitude-modulated RF excitation pulse into the patient 101. Thereby, a transverse magnetization is created. For the creation of such RF excitation pulses, an RF transmitter unit 131 is connected via an RF switch 130 with the RF coil arrangement 121. The RF transmitter unit 131 can include an RF generator and an RF amplitude modulation unit. The RF excitation pulses deflect the magnetization from the rest position in a slice selective manner, or 2D/3D spatially resolved.

Further, an RF receiver unit 132 is coupled via the RF switch 130 with the RF coil arrangement 121. With the RF receiver unit 132, MR signals of the relaxation transverse magnetization can be detected as raw data, e.g., via inductive coupling to the RF coil arrangement 121. In general, it is possible to employ separate RF coil arrangements 121 for radiating the RF excitation pulses via the RF transmitter unit 131 and for acquiring the raw data with the RF receiver unit 132. For example, for the acquisition of the raw data an RF coil arrangement 121 can be used that is formed by an array of RF coils. The RF coil arrangement 121 for acquiring the raw data can have 32 individual RF coils, for example, and thereby be used for parallel imaging. Various techniques for this are known to those of ordinary skill in MR imaging so there is no need to explain further details in this context.

The MR apparatus 100 further has an interface 150 that can include, e.g., a display, a keyboard, a mouse, etc. By means of the interface 150, a user input can be detected and output to the user can be implemented. For example, it can be possible to set various modes of operation, that define respective operating parameters of the MR apparatus 100 by the user and/or automatically and/or by remote control.

Further, the MR apparatus 100 has a processor 160. The processor 160 can be configured, e.g., to create an MR image from the raw data that are acquired via the RF receiver. For this it is possible to apply, e.g., techniques of parallel imaging, as well as respective Fourier transformations between the spatial frequency domain, in which the raw data are present, and the image domain, in which the MR image is obtained.

Although the various units discussed above of the MR apparatus 100 are illustrated separately in FIG. 1, it should be understood that individual units can be implemented in a combined manner, e.g., in software and/or hardware—e.g., as part of a central processing system.

In the following figures further details of the operation of the MR entity 100 are illustrated. In FIG. 10, an EPI measurement sequence is illustrated. Both the sequence 201 of the readout gradient fields 201a, as well as the sequence 202 of the phase encoding gradient fields 202a are described by trapezoidal gradient fields 201a, 202a. From FIG. 10 it can be seen that the sequences 201, 202 in readout and phase encoding gradient field direction are synchronized in time in such a manner that zero crossings of the readout gradient fields 201a are coincident in time with the zero crossing of the phase encoding gradient fields 202a (vertical dashed lines in FIG. 10). At the same time the extreme values (minimum values and maximum values) of the readout gradient fields 201a are coincident in time with the extreme values of the phase encoding gradient fields 202a. In particular, both the sequence 201 of the readout gradient fields 201a as well as the sequence 202 of the phase encoding gradient fields 202a are described by the same analytical function (trapezoidal function). In FIG. 10, a certain duration of the shoulders of the trapezoidal gradient fields 201a, 202a is intentionally selected.

Figure 11:
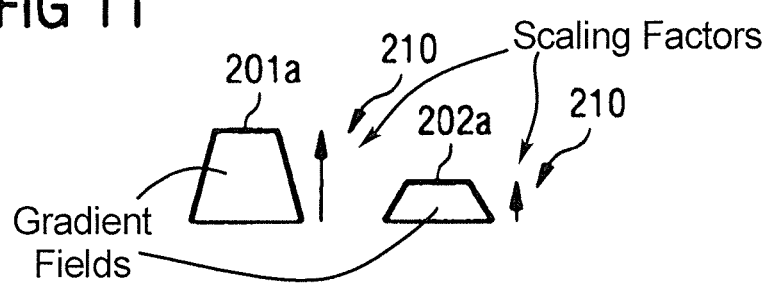
FIG. 11 illustrates a scaling factor between the values of the phase encoding gradient fields and the readout gradient fields of the measurement sequence of FIG. 10.

Further, the sequence 202 of the phase encoding gradient fields 202a relates to the scaled absolute value of the function which describes the sequence 201 of the readout gradient fields 201a. In FIG. 11, the scaling factor 210 is illustrated. The scaling factor 210 relates to the ratio of the amplitudes of the phase encoding gradient fields 202a with respect to the amplitudes of the readout gradient fields 201a. In FIG. 11, the scaling factor 210 amounts to approximately 0.46. Other scaling factors, preferably between 0 and 1, can be selected.

Figure 12:
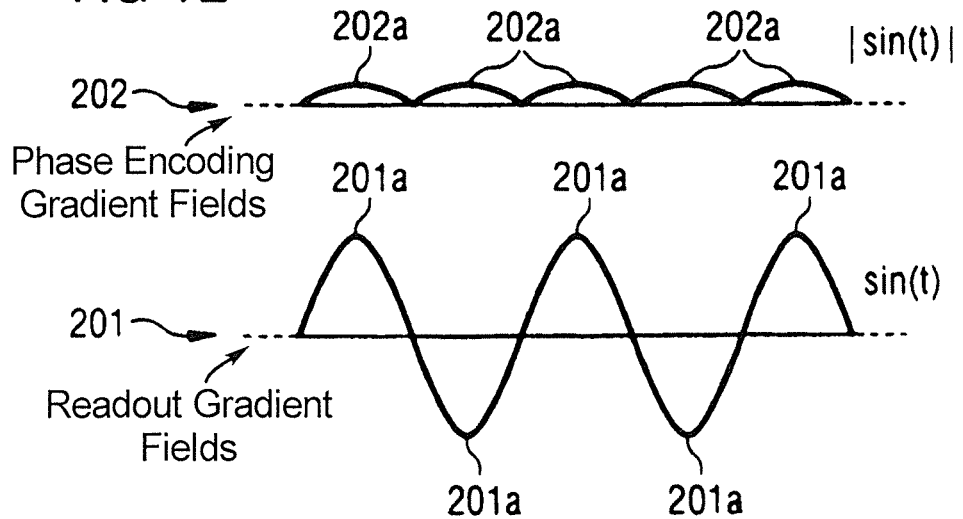
FIG. 12 illustrates a further sequence of readout gradient fields and of phase encoding gradient fields of an EPI measurement sequence according to various embodiments of the present invention.

In FIG. 12, a respective scenario of a further EPI measurement sequence is illustrated. The sequence 201a of the readout gradient fields 201a is described by a sinusoidal function. The sequence 202 of the phase encoding gradient fields 202a is described by the absolute value of the same sinusoidal function, multiplied by the scaling factor (cf. FIG. 11).

The EPI measurement sequence of FIGS. 10 and 12 have in common that the sequence 202 of the phase encoding gradient fields 202a is configured in such a manner that the phase encoding gradient fields 202a only have positive values, as a function of time continuously increment a phase of the transverse magnetization (compare with FIG. 1) and have values that vary as a function of time (compare with FIGS. 2 and 3).

In FIG. 13, the trajectory 300 of the EPI measurement sequence of FIG. 12 is illustrated with the solid line. As can be seen from FIG. 13, the trajectory 300 has two flanks 310a, 310b, which have no or only a small curvature, respectively run in linear. This particularly applies in comparison to the trajectories 300 of the EPI measurement sequences that have been discussed above with reference to FIGS. 7 and 8. In this light, for the purpose of comparison in FIG. 13 the trajectory 300 of the EPI measurement sequence of FIG. 2 is illustrated with the dashed line. Further, in FIG. 13 data points 320 are illustrated: these data points 320 can be obtained from a gradient echo that relates to a particular readout gradient field 202a and describes a flank 310. As can be seen from FIG. 13, a one-dimensional density of the data points 320 varies along the trajectory 300. In particular, this density of the data points 320 is larger (or smaller) at points having a larger (or smaller) distance to the k-space center. In other words, the distance between neighboring data points 320 decreases along the trajectory 300 for larger absolute values in $k_x$-direction 401. This is due to the decreasing (or increasing) amplitude of the gradient fields 201a, 202b for smaller (or larger) distances to the k-space center along the $k_x$-direction 401.

In FIGS. 14 and 15 hereinafter the influence of the amplitude of the phase encoding gradient fields 202a, respectively of the scaling factor 210, on the trajectory 300 is discussed. In FIG. 14, the distance between two flanks 310a, 310b running in parallel amounts to $2\Delta k_y$. An amplitude of the phase encoding gradient fields 202a being twice as large, respectively a scaling factor 210 being twice as large, results in the distance amounting to $4\Delta k_y$, see FIG. 15. If in FIG. 14 twelve gradient echoes are acquired and thus twelve k-space rows are filled, then in FIG. 15 only six gradient echoes would be acquired. The number of the data points 320 of the raw data therefore reduces by a factor of 2. It can then be impossible or only possible to a limited degree to execute a transformation of the raw data to the image domain directly by means of interlaced Fourier transformation. This can be the case as according to the known Nyquist theorem a minimum density of data points 320 is required to obtain a certain desired spatial resolution. Hereinafter techniques are discussed that enable missing raw data to be reconstructed, respectively data points 320 by means of parallel imaging (PPA) techniques. Thereby, the density of data points can be increased, e.g., by means of calculation subsequent to the data acquisition.

On the left side in FIG. 16 the direction of the trajectory 300 of FIG. 15 is shown by means of arrows along which the k-space is sampled. As can be seen, the y-component of the k-vector increases continuously. The zigzag-type trajectory 300 has a first class 311 of flanks 310a which is associated with readout gradient fields 201a having positive values. Further, the zigzag-type trajectory 300 has a second class 312 of flanks 310b that is associated with negative values of the readout gradient fields 201a. In FIG. 16 it is shown on the right side how the zigzag-type trajectory 300 can be separated into the flanks 310a of the first class 311 and the flanks 310b of the second class 312. As can be seen from FIG. 16, the flanks 310a, 310b of the same class 311, 312 are parallel with respect to each other and have a distance of $4\Delta k_y$ with respect to each other. Also the direction of sampling along the trajectory 300 is identical for neighboring flanks 310a, 310b of the same class 311, 312. In FIG. 16, those flanks are illustrated with dashed for which no raw data have been acquired and that respectively have a distance of $2\Delta k_y$ to measured and neighboring flanks of the respective class.

FIG. 17 shows the application of GRAPPA techniques for reconstruction of a reconstructed data point 321 from a number of data points 330a and 330b of the acquired raw data that respectively are situated on neighboring flanks 310a of the first class. In the case of FIG. 18, a reconstruction kernel of dimension 2×3 source data points (two neighboring data points in phase encoding direction $k_y$-direction 402 and three neighboring data points in readout direction $k_x$-direction 401) is employed. In general, it is possible to employ also reconstruction kernels having a different combination of source data points. Due to the symmetry of the data points 330a of the first class (of the second class 312, not shown in FIG. 18) having the equidistant distance of $4\Delta k_y$, it is possible to use one and the same reconstruction kernel in the entire section. However, it can be desirable to employ a different, further reconstruction kernel, e.g., at both ends of the respective flanks 310a (i.e., at relatively large $k_x$-vectors 401, end-of-flank k-space data points 330b) for obtaining the reconstructed data points 321—in this regard in the lower part of FIG. 18, a 2×2 reconstruction kernel is illustrated.

The techniques discussed with reference to FIG. 17 relating to GRAPPA reconstruction are in principle known, see, e.g., M. A. Griswold "Advanced k-space techniques", Second International Workshop on Parallel Imaging, Zurich, Switzerland (2004) 16. However, it should be understood that in comparison to GRAPPA techniques that are applied to Cartesian trajectories, presently the additional effect of suppressed phase differences for k-space data points 330a and 330b on neighboring flanks 310a, 310b can be achieved: as can be seen from FIG. 17, the neighboring flanks 310a from which the reconstructed data point 321 is reconstructed has the same phase evolution (increasing in $k_x$- and $k_y$-direction). Thereby, a more accurate reconstruction, namely a reconstruction that is subject to lower signal noise of the reconstructed data points 321, can be achieved.

Hereinafter techniques are illustrated for determining the reconstruction kernel. With reference to FIGS. 14 and 15 it has been discussed how an acceleration factor equaling 2 can be achieved. The reconstruction parameters required for GRAPPA to determine the reconstruction kernel can be obtained from so-called reference data, such as ACF data. This relates to a data set that has been acquired with at least the density of sampling, respectively with at least the density of data points, which should be obtained for the reconstructed k-space after the GRAPPA reconstruction. With reference to FIGS. 15 and 16, this means that the respective data points 320 that are situated on the dashed line are measured.

In FIG. 18, a technique is illustrated that allows to sample the two trajectories 300a, 300b to be sampled separately for acquiring the raw data by radiating two separate RF excitation pulses. It is then possible to obtain raw data as reference data for the two separately undersampled k-space data sets along the trajectories 300a, 300b, where neighboring parallel flanks 310 have the same readout direction (respectively increasing or decreasing along the $k_x$-direction). When determining the reconstruction kernel it is therefore possible to avoid, or reduce, phase differences due to different readout directions.

FIG. 19 shows the two trajectories 300a, 300b obtained by radiating a single RF excitation pulse. As can be seen from FIG. 19, neighboring parallel flanks 310 have opposing readout direction. Although the measurement sequence described with reference to FIG. 19 can allow for a fast acquisition of the reference data as raw data because a single RF excitation pulse is radiated, somewhat large phase differences, particularly with respect to the situation of FIG. 18, can occur.

In FIG. 20, a flowchart of a method for echo planar MR imaging according to various embodiments is illustrated. The method starts with step S1. In step S2, the radiation of an RF pulse for the creation of a transverse magnetization occurs. In step S3 the application of the sequence 201 of readout gradient fields 201a and the sequence 202 of phase encoding gradient fields 202a occurs. Due to the application of only positive phase encoding gradient fields 202a as well as oscillating readout gradient fields 201a, the zigzag-type trajectory 300 is achieved. As discussed above with reference, e.g., to FIGS. 10 and 12, it is possible by means of the particular arrangement of the sequences 201, 202 as well as by means of the temporal synchronization of the gradient fields 201a, 202a to achieve a well-defined and preferably ideal zigzag-type trajectory 300 in step S4 for the sampling of k-space.

From the raw data acquired in step S4, it is then possible in step S5 to obtain a MR image by applying of a Fourier transformation. The method ends in step S6.

For example, it is possible for the acquisition of the raw data in step S4 to be executed as part of a zigzag-type trajectory 300, which undersamples k-space. For example, by selecting a specific scaling factor 210 (see FIG. 11), namely a specific amplitude of the phase encoding gradient fields 202a, the inclination of the flanks 310 of the trajectory 300 is increased such that the integral density of the data points 320 decreases. It can then be possible to reconstruct the non-acquired raw data by means of techniques of parallel imaging, in particular by means of GRAPPA-type techniques. This is illustrated with reference to the flowchart of FIG. 21.

For example, the steps T1 and T2 of FIG. 21 can be executed as part of the method as discussed above with reference to FIG. 20. First, in step T1, the determination of a reconstruction kernel takes place. In general, the determination of the reconstruction kernel uses the reference raw data by means of techniques known by those of ordinary skill. Further details are also discussed below with reference to FIG. 22.

In step T2 the actual GRAPPA reconstruction occurs: the applying of the reconstruction kernel as determined in step T1 to the data points 320 of neighboring and parallel flanks 310a, 310b of the zigzag-type trajectory 300 occurs. For this the flanks 310a, 310b can be grouped into two classes 311, 312: flanks of the same class are parallel with respect to each other and have the same readout direction. Therefore, it can be possible in step T2 to apply GRAPPA reconstruction that are known for use with Cartesian trajectories.

In FIG. 22, the determining of the reconstruction kernel as required for the GRAPPA reconstruction in step T2 of FIG. 21 is shown as part of a further flowchart.

In step U1, the radiating of the first RF pulse to create the transverse magnetization occurs. Then in step U2 the applying of the sequence of calibration readout gradient fields and of the sequence of calibration phase encoding gradient fields occurs, to obtain the first zigzag-type trajectory 300a (see FIG. 18, middle part). In step U3 gradient echoes are acquired as reference data along the first zigzag-type trajectory 300a.

In step U4 the radiation of the second RF pulse occurs. In step U5 the sequence of calibration readout gradient fields and the sequence of calibration phase encoding gradient fields is applied to acquire gradient echoes as reference data along the second trajectory 300b (step U6). In step U7 the calculation of the reconstruction kernel from the reference data that are situated on the first and second trajectories 300a, 300b occurs.

Of course, features of the embodiments described above and aspects of the invention can be combined with each other. In particular, the various features cannot only be used in the combinations as described, but also in further combinations or in isolation without departing from the scope of the invention. As the embodiments have been described above predominantly with respect to GRAPPA reconstruction techniques, it should be understood that other techniques of parallel imaging can be employed, e.g., time domain-based reconstruction techniques, such as SENSE.

Above, reference has been made predominantly to the sequence of phase encoding gradient fields that has been configured such that the phase encoding gradient fields only have positive values that continuously increase the phase of the transverse magnetization as a function of time. It should be understood that the relative terms "positive" and "increment" are not to be construed as limiting with respect to a particular reference coordinate system. Rather, it is possible that the physically identical fields have different values in different coordinate systems and nonetheless fall under the scope of the invention. Respective techniques can therefore immediately be applied to a sequence of phase encoding gradient fields where the phase encoding gradient fields only have negative values and/or the phase of the transverse magnetization is continuously decremented.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for echo planar magnetic resonance (MR) imaging, comprising:
    operating an MR data acquisition unit, in which a subject is situated, to acquire MR raw data from the subject in an echo planar MR imaging sequence including, in said echo planar MR imaging sequence, radiating a radio-frequency (RF) pulse that produces a transverse magnetization of nuclear spins in the subject, said transverse magnetization of said nuclear spins exhibiting a phase;
    operating said MR data acquisition unit in said echo planar MR imaging sequence to also apply a sequence of readout gradient fields configured with alternating positive and negative values, and to apply a sequence of phase encoding gradient fields configured to have only positive values that vary as a function of time and that continuously increase the phase of the transverse magnetization as a function of time, or to have only negative values that vary as a function of time and that continuously decrease the phase of the transverse magnetization as a function of time, wherein applying said sequence of readout gradient fields and applying said sequence of phase encoding gradient fields produces a zigzag-type trajectory for entering MR raw data into an electronic memory organized as k-space;
    operating said MR data acquisition unit in said echo planar MR imaging sequence to acquire said MR raw data representing gradient echoes resulting from said transverse magnetization, while applying said sequence of readout gradient fields and said sequence of phase encoding gradient fields, and entering the acquired MR raw data into k-space along said zigzag-type trajectory; and
    via a processor having access to said memory, making the MR raw data in k-space available in electronic form as a data file.

2. A method as claimed in claim 1 comprising operating said MR data acquisition unit in said echo planar MR imaging sequence with said sequence of readout gradients and said sequence of phase encoding gradients synchronized in time to give said zigzag-type trajectory substantially linear flanks.

3. A method as claimed in claim 1 comprising:
    operating said MR data acquisition unit in said echo planar MR imaging sequence to apply said sequence of readout gradient fields configured to have values described by a first time-dependent function;
    operating said MR data acquisition unit in said echo planar MR imaging sequence to apply said sequence of phase encoding gradient fields configured to have values described by a second time-dependent function that equals an absolute value of said first time-dependent function, multiplied by a scaling factor.

4. A method as claimed in claim 1, comprising:
    operating said MR data acquisition unit in said echo planar MR imaging sequence with said sequence of readout gradient fields configured to have values described by a sinusoidal-type time-dependent function; and operating said MR data acquisition unit in said echo planar MR imaging sequence with said sequence of phase encoding gradient fields configured to have values described by an absolute value of said sinusoidal-type time-dependent function, multiplied by a scaling factor.

5. A method as claimed in claim 1 comprising operating said MR data acquisition unit in said echo planar MR imaging sequence with at least one of said sequence of readout gradient fields or said sequence of phase encoding gradient fields configured to give a density of data points of said MR raw data along said zigzag-type trajectory periodically varying values.

6. A method as claimed in claim 5 comprising operating said MR data acquisition unit in said echo planar MR imaging sequence with said at least one of said sequence of readout gradients and said sequence of phase encoding gradients configured to give said density higher values for larger distances along a readout direction of k-space, with respect to a center of k-space, than for smaller distances along said readout direction of k-space.

7. A method as claimed in claim 1 comprising:
operating said MR data acquisition unit in said echo planar MR imaging sequence with said sequence of readout gradient fields and said sequence of phase encoding gradient fields synchronized in time to cause at least one of: maximum values of said phase encoding gradient fields to be coincident with extreme values of said readout gradient fields, or zero crossings of said phase encoding gradient fields to be coincident with zero crossing of said readout gradient fields.

8. A method for echo planar magnetic resonance (MR) imaging, comprising:
operating an MR data acquisition unit, in which a subject is situated, to acquire MR raw data from the subject in an echo planar MR imaging sequence including, in said echo planar MR imaging sequence, radiating a radio-frequency (RF) pulse that produces a transverse magnetization of nuclear spins in the subject, said transverse magnetization of said nuclear spins exhibiting a phase;

operating said MR data acquisition unit in said echo planar MR imaging sequence to also apply a sequence of readout gradient fields configured with alternating positive and negative values, and to apply a sequence of phase encoding gradient fields configured to have only positive values that continuously increase the phase of the transverse magnetization as a function of time, or to have only negative values that continuously decrease the phase of the transverse magnetization as a function of time, wherein applying said sequence of readout gradient fields and applying said sequence of phase encoding gradient fields produces a zigzag-type trajectory for entering MR raw data into an electronic memory organized as k-space;

operating said MR data acquisition unit in said echo planar MR imaging sequence to acquire said MR raw data, via multiple receiver coils of said MR data acquisition unit, representing gradient echoes resulting from said transverse magnetization, while applying said sequence of readout gradient fields and said sequence of phase encoding gradient fields, and entering the acquired MR raw data into k-space along said zigzag-type trajectory, said zigzag-type trajectory in k-space exhibiting a first class of flanks that have positive values of said readout gradient fields and a second class of flanks that have negative values of the readout gradient fields; and from a processor, accessing said MR raw data in said electronic memory and applying a parallel MR image reconstruction algorithm to said MR raw data to obtain a data file representing an MR image of the subject, and making said data file available at an output of the processor in electronic form.

9. A method as claimed in claim 8 wherein k-space represents a spatial frequency domain, said method comprising:
in said processor, applying said reconstruction algorithm to said MR raw data in the spatial frequency domain represented by k-space, and reconstructing a plurality of reconstructed data points in said spatial frequency domain from a plurality of data points of said MR raw data in k-space that are situated on neighboring flanks of a same class of said flanks.

10. A method as claimed in claim 9 comprising:
reconstructing a reconstructed flank from said plurality of reconstructed data points, said reconstructed flank belonging to the same class as the flanks in which said plurality of MR raw data points are situated in k-space.

11. A method as claimed in claim 9 comprising, in said processor, executing said reconstruction algorithm using at least one reconstruction kernel having a predetermined dimension in k-space.

12. A method as claimed in claim 11 comprising determining said at least one reconstruction kernel by:
operating said MR data acquisition unit, in which said subject is situated, in a calibration sequence;

operating said MR data acquisition unit in said calibration sequence to radiate a calibration sequence RF pulse that gives said nuclear spins in said subject a transverse magnetization, said transverse magnetization exhibiting a phase;

operating said MR data acquisition unit in said calibration sequence to apply a sequence of calibration readout gradient fields configured to have alternating positive and negative values, and to apply a sequence of calibration phase encoding gradient fields configured to have only positive values that continuously increment the phase of the transverse magnetization as a function of time, or only negative values that continuously decrement said phase of said transverse magnetization as a function of time;

operating said MR data acquisition unit in said calibration sequence with said sequence of calibration readout gradient fields and said sequence of calibration phase encoding gradient fields configured to obtain a first zigzag-type calibration trajectory for entering raw MR calibration data into an electronic memory organized as k-space, and to obtain a second zigzag-type calibration trajectory for entering said raw MR calibration data into k-space, said first zigzag-type calibration trajectory and said second zigzag-type calibration trajectory each consisting of a first class of flanks having positive values of the calibration readout gradient fields and a second class of flanks having negative values of said calibration readout gradient fields, with an inclination of the flanks produced by said sequence of calibration readout gradient fields and said sequence of calibration phase encoding gradient fields equaling an inclination of the flanks produced by said sequence of readout gradient fields and said sequence of said phase encoding gradient fields;

operating said MR data acquisition unit in said calibration sequence to acquire said raw MR calibration data representing calibration gradient echoes produced by said transverse magnetization during said sequence of calibration readout gradient fields and said sequence of calibration phase encoding gradient fields, and entering said raw MR calibration data into k-space along said first zigzag-type calibration trajectory and along said second zigzag-type calibration trajectory; and in said processor, calculating said at least one reconstruction kernel from raw MR calibration data points situated on neighboring parallel flanks of said first and second zigzag-type calibration trajectories.

13. A method as claimed in claim 12 comprising:

entering said raw MR calibration data into k-space along said first and second zigzag-type calibration trajectories to cause a first flank of said first zigzag-type calibration trajectory and a second flank of said second zigzag-type calibration trajectory, which are neighboring in the spatial frequency domain represented by k-space and that proceed parallel to each other in k-space, to both contain data points acquired with positive values or negative values of said calibration readout gradient fields.

14. A method as claimed in claim 9 comprising using a Cartesian Generalized Autocalibrating Partially Parallel Acquisition (GRAPPA) reconstruction algorithm as said parallel MR imaging reconstruction algorithm.

15. A method as claimed in claim 8 comprising, in said processor prior to executing said reconstruction algorithm, transforming data points of said MR raw data from the spatial frequency domain represented by k-space into the image domain by at least one of interlaced Fourier transformation, re-gridding of data points to a regular Cartesian grid in the spatial frequency domain, or bunched phase encoding.

16. A magnetic resonance (MR) apparatus, comprising:

an MR data acquisition unit comprising at least one radio-frequency (RF) transmission coil, a gradient system, and at least one RF reception coil;

a control unit configured to operate the MR data acquisition unit, while a subject is situated therein, to acquire MR raw data from the subject in an echo planar MR imaging sequence including, in said echo planar MR imaging sequence, radiating from at least one RF pulse transmission coil that produces a transverse magnetization of nuclear spins in the subject, said transverse magnetization of said nuclear spins exhibiting a phase;

said control unit being configured to operate said MR data acquisition unit in said echo planar MR imaging sequence to also apply, from said gradient system, a sequence of readout gradient fields configured with alternating positive and negative values, and to apply a sequence of phase encoding gradient fields configured to have only positive values that vary as a function of time to continuously increase the phase of the transverse magnetization as a function of time, or to have only negative values that vary as a function of time to continuously decrease the phase of the transverse magnetization as a function of time, wherein applying said sequence of readout gradient fields and applying said sequence of phase encoding gradient fields produces a zigzag-type trajectory for entering MR raw data into an electronic memory organized as k-space;

said control unit being configured to operate said MR data acquisition unit in said echo planar MR imaging sequence to acquire, with said at least one RF reception coil, said MR raw data representing gradient echoes resulting from said transverse magnetization, while applying said sequence of readout gradient fields and said sequence of phase encoding gradient fields, and entering the acquired MR raw data into k-space along said zigzag-type trajectory; and a processor configured to access to said memory and make the MR raw data in k-space available in electronic form as a data file.

17. A magnetic resonance (MR) apparatus, comprising:

an MR data acquisition unit comprising at least one radio-frequency (RF) transmission coil, a gradient system, and multiple RF reception coils;

a control unit being configured to operate the MR data acquisition unit, while a subject is situated therein, to acquire MR raw data from the subject in an echo planar MR imaging sequence including, in said echo planar MR imaging sequence, radiating an RF pulse from said at least one RF transmission coil that produces a transverse magnetization of nuclear spins in the subject, said transverse magnetization of said nuclear spins exhibiting a phase;

said control unit being configured to operate said MR data acquisition unit in said echo planar MR imaging sequence to also apply, from said gradient system, a sequence of readout gradient fields configured with alternating positive and negative values, and to apply a sequence of phase encoding gradient fields configured to have only positive values that continuously increase the phase of the transverse magnetization as a function of time, or to have only negative values that continuously decrease the phase of the transverse magnetization as a function of time, wherein applying said sequence of readout gradient fields and applying said sequence of phase encoding gradient fields produces a zigzag-type trajectory for entering MR raw data into an electronic memory organized as k-space;

said control unit being configured to operate said MR data acquisition unit in said echo planar MR imaging sequence to acquire said MR raw data, via said multiple reception coils of said MR data acquisition unit, representing gradient echoes resulting from said transverse magnetization, while applying said sequence of readout gradient fields and said sequence of phase encoding gradient fields, and entering the acquired MR raw data into k-space along said zigzag-type trajectory, said zigzag-type trajectory in k-space exhibiting a first class of flanks that have positive values of said readout gradient fields and a second class of flanks that have negative values of the readout gradient fields; and a processor configured to access said MR raw data in said electronic memory and apply a parallel MR image reconstruction algorithm to said MR raw data to obtain a data file representing an MR image of the subject, and to make said data file available at an output of the processor in electronic form.

* * * * *